United States Patent [19]
Weber et al.

[11] Patent Number: 6,110,216
[45] Date of Patent: *Aug. 29, 2000

[54] OCCUPANT BASED DESIGN METHOD FOR AN AUTOMOTIVE VEHICLE

[75] Inventors: William Francis Weber, Bloomfield Hills; Daniel Cornelius Bach, Jr., Belleville; Scott Ming-Hua Tang, Ypsilanti; Mark Russell Henault, Milford; Sean James Sevrence, Temperance; Michael Joseph Walraven, Ypsilanti; Frederick Abraham Karam, Allen Park, all of Mich.

[73] Assignee: Ford Global Technologies, Inc., Dearborn, Mich.

[ * ] Notice: This patent is subject to a terminal disclaimer.

[21] Appl. No.: 08/984,790

[22] Filed: Dec. 4, 1997

(Under 37 CFR 1.47)

[51] Int. Cl.⁷ .............................. G06F 17/50; G06F 9/455
[52] U.S. Cl. .................................. 703/8; 703/1; 345/419
[58] Field of Search .................. 395/500.01, 500.29, 395/500.37; 345/333, 348, 353, 356, 419, 473, 339, 355; 364/148.01, 149, 150, 151, 468.01, 468.02, 468.03, 468.04, 468.09, 468.1, 468.12; 180/271, 286, 287; 280/1; 434/29, 257, 267, 365, 370, 373; 382/104

[56] References Cited

U.S. PATENT DOCUMENTS

| | | | |
|---|---|---|---|
| 4,439,824 | 3/1984 | Mayer | 700/30 |
| 4,625,329 | 11/1986 | Ishikawa et al. | 382/104 |
| 4,811,240 | 3/1989 | Ballou et al. | 345/334 |

(List continued on next page.)

FOREIGN PATENT DOCUMENTS

| | | |
|---|---|---|
| 0 401 900 A1 | 5/1990 | European Pat. Off. . |
| 2 240 414 | 12/1990 | United Kingdom . |

OTHER PUBLICATIONS

R.W. McLay et al., "Erogonomics, spinal injury, and industrial vehicle safety", Proceedings of the 1996 Fifteenth Southern Biomedical Engineering Conference, 1996, pp. 191–194.

(List continued on next page.)

*Primary Examiner*—Kevin J. Teska
*Assistant Examiner*—Russell W. Frejd
*Attorney, Agent, or Firm*—David B. Kelley

[57] ABSTRACT

A computer based system and method for designing an automotive vehicle orients an occupant representation, in electronic form, with respect to a three-dimensional electronic representation of a portion of the vehicle. At least one vehicle system is represented, also in electronic form, with respect to a common reference point, at least one human factors study is electronically performed to determine occupant interaction with at least one vehicle system, and an outcome of that study is reported to a vehicle designer. The designer then has an option to vary, or alter, the occupant orientation, the location of the vehicle system, or both, so that the design meets a predetermined criteria of the study. However, the designer may opt to retain the design despite non-compliance with the criteria. If a parameter change is made, the system and method automatically rebuild every other effected dimension, and vehicle systems to satisfy the regenerated design are automatically selected from an electronic parts library so that packaging alternatives can be quickly studied. A geometric representation of occupant interaction relative to a vehicle system may be displayed to allow a designer to visually assess compliance with a particular criteria. The occupant representation, vehicle, vehicle system, and geometric representation of the interaction may be rendered and animated in three-dimensions permitting views from various perspectives. The method and system can quickly provide accurate human factors studies for a vehicle design while allowing system packaging flexibility.

50 Claims, 20 Drawing Sheets

(15 of 20 Drawing Sheet(s) Filed in Color)

U.S. PATENT DOCUMENTS

| | | | |
|---|---|---|---|
| 4,912,657 | 3/1990 | Saxton | 345/356 |
| 5,033,014 | 7/1991 | Carver et al. | 703/1 |
| 5,070,534 | 12/1991 | Lascelles et al. | 345/348 |
| 5,111,413 | 5/1992 | Lazansky et al. | 703/16 |
| 5,189,626 | 2/1993 | Colburn | 700/182 |
| 5,197,120 | 3/1993 | Saxton et al. | 345/439 |
| 5,293,479 | 3/1994 | Quintero et al. | 345/353 |
| 5,481,465 | 1/1996 | Itoh | 700/118 |
| 5,590,268 | 12/1996 | Doi et al. | 345/326 |
| 5,729,463 | 3/1998 | Koenig et al. | 700/98 |
| 5,761,063 | 6/1998 | Jannette et al. | 700/97 |
| 5,799,293 | 8/1998 | Kaepp | 706/45 |
| 5,844,554 | 12/1998 | Geller et al. | 345/333 |

OTHER PUBLICATIONS

S. Aono, "The Next Step in Automotive Electronic Control", International Congress on Transportation Electronics, 1988, Convergence 88, pp. 83–89.

M. Asano et al., "New Approach in Automotive Control — An Experimental Variable–Response Vehicle", 1991 International Conference on Industrial Electronics, Control and instrumentation 1991, IECON '91, pp. 123–128.

P.A.J. Barham et al., "The Ergonomic and Safety Implication of In–Car ATT Devices — Evidence from Field Trials with Elderly Drivers", IEE Colloquium on Design of the Driver Interface, 1995, pp. 4/1–4/3.

A. Pauzie et al., "Ergonomic Evaluation of a Prototype Guidance System in an Urban Area. Discussion about methodologies and data collection tools", Vehicle Navigation and Informationa Systems Conference, 1995, In Conjunction with the Pacific Rim TransTech Conference, 6th International VNIS, pp. 390–396.

J.L. Campbell, "Development of Human Factors Design Guidelines for Advanced Traveler Information Systems (ATIS)", Vehicle Navigation and Information Systems Conference, 1995, In Conjunction with the Pacific Rim TransTech Conference, 6th International VNIS, pp. 161–164.

J. Laird Evans et al., "In–Vehicle Man–Machine Interaction–the SOCRATES approach", Vehicle Navigation anf Information Systems Conference 1994, pp. 473–477.

T.S. Abbott et al., "Functional Catagories for Human–Centered Flight Deck Design", Digital Avionics Systems Conference, 1993, 12th DASC, AIAA/IEEE, pp. 66–74.

E.J. Hartzell e tal., "Computational Human Factors in Human–Machine Engineering — The Army–NASA Aircrew/Aircraft Integration (A/sup 3/l) Program", Proceedings of the IEEE 1988 National Aerospace and Electronics Conference, 1988 NAECON 1988, pp. 819–822.

SAE J903c, Nov. 1973 — "Passenger Car windshield Wiper Syhstems".

SAE J1052, May 1987 — "Motor Vehicle Driver and Passenger Head position".

SAE J100, Mar. 1988 — "Passenger Car Glazing shade Bands".

SAE J287, Jun. 1988 — "Driver Hand Control Reach".

SAE J1516, Mar. 1990 — "Accommodation Tool Reference Point".

SAE J1517, Mar. 1990 — "Driver Selected Seat Point".

SAE J1521, Mar. 1990 — "Truck Driver Shin–Knee Position For Clutch and Accelerator".

SAE J1522, Mar. 1990 — "Truck Driver Stomach Position".

SAE J826, Jun. 1992 — "Devices for Use in Defining and Measuring Vehicle Seating Accommodation".

SAE J941, Jun. 1992 — "Motor Vehicle Drivers' Eye Locations".

SAE J902, Apr. 1993 — "Passenger Car Windshield Defrosting Systems".

SAE J198, Jun. 1993 — "Windshield Wiper Systems — Trucks, Buses, and Multipurpose Vehicles".

SAE J1100, Jun. 1992 — "Motor Vehicle Dimensions".

SAE J1050 — Describing and Measuring the Driver's Field of View.

"Automating Design in Pro/Engineer with Pr/Program", Mark Henauld, Sean Sevrence and Mike Walraven (Onword Press) 1997.

Chrysler Puts Comfort in the Front Seat with Ilog Tools (S. Alexander) Internet Web Site http://www.infoworld.com/pageone/special/eccase042296.htm (Internet publication date unknown).

Inspec acc. No. 2832913, SAMMIE: a computer aided design tool for ergonomists, Proc. Human Factors Soc. $30^{th}$ meeting, vol. 1, pp. 695–698, Dayton Ohio, Sep. 29–Oct. 3, 1986.

Inspec acc. No. 4408183, Use of ergonomic workspace modelling in vehicle design, CAES '92, pp. 145–152, 1992.

TECHMATH releases RAMSIS 3.4 Human–Modeling Software, at www.nasatech.com/NEWS/techmath_0119.html.

INSPEC Acc. No. 1816358, SAMMIE: A Computer Aid for Man Machine Modelling, 8th Annual Conerence on Computer Graphics and Interactive Techniques, Computer Graphics, Aug. 1981, vol. 15, No. 3, pp. 163–169.

F. Purschke et al., Virtual Reality — New Methods for Improving and Accelerating the Development Process in Vehicle Styling and Design, Computer Graphics International, 1998, pp. 789–797.

OCCUPANT BASED DESIGN METHOD FOR AN AUTOMOTIVE VEHICLE

FIELD OF THE INVENTION

The present invention relates to computer aided automotive vehicle design, in general, and more specifically to occupant based vehicle design.

BACKGROUND OF THE INVENTION

Early automotive vehicle design had, as a goal, the object of providing a transportation alternative to a horse-and-buggy, with passenger comfort as a secondary consideration, at best. Vehicle design has advanced to a state in which occupant comfort and convenience, sometimes called ergonomics or human factors, is on at least an even par with the transportive aspects of a vehicle. This evolution has been driven by the availability of new technologies, including instrument panel clusters, adjustable steering wheels and columns, vehicle electronics, and movable seats, to mention only a few. With the addition of each new technological application to the automotive vehicle environment, however, comes additional complexity in packaging the various occupant appurtenances to best achieve both design and ergonomic functionality.

To meet this packaging task, current practice relies on various methods to determine whether a proposed design meets human factors requirements. Typically, a proposed design is analyzed in two-dimensions which requires many "cuts" of a drawing. A three- dimensional "buck" is also used to give a better overall view of the design, but such physical representations are expensive, time consuming, and difficult to modify for a subsequent design. Since there may be many individual components which affect occupant comfort and convenience, the tasks associated with capturing all of the required human factors packaging requirements are daunting. For example, a single rimblock study, which determines viewable parts of an instrument panel from a vehicle driver perspective, can require 4–6 hours to complete. In total, performing human factors studies typically requires many weeks under current practice, assuming the availability of experienced analysts to conduct all of the individual studies.

An additional problem with current design practice is that it leaves room for errors, due to the complex instructions required to perform the studies. Current design practice also is inflexible in that a change in one component, even a minor component, requires all human factors studies to be redone, resulting in greater expense and delay of design completion.

SUMMARY OF THE INVENTION

The present invention overcomes the deficiencies of current vehicle design practice by providing a method and system which can quickly provide accurate human factors studies for a vehicle design while allowing system packaging flexibility. The computer based system and method of the present invention orients an occupant representation, in electronic form, with respect to a three-dimensional electronic representation of a portion of the vehicle. At least one vehicle system is represented, also in electronic form, with respect to a common reference point. At least one human factors study is performed to determine occupant interaction with at least one vehicle system, and an outcome of that study is reported to a vehicle designer. The designer then has an option to vary, or alter, the occupant orientation, the location of the vehicle system, or both, so that the design meets the human factors criteria of the study. When a change is made to the occupant orientation, a vehicle system, or any design parameter, regeneration of the entire vehicle design is electronically performed. During this regeneration step, appropriate relationships between the occupant representation, the vehicle systems, and the vehicle are automatically determined, and vehicle systems are automatically changed according to the revised parameters. However, the designer may opt to retain a design despite noncompliance with the human factors criteria. In addition, a geometric representation of occupant interaction with a vehicle system may be displayed to allow a designer to assess compliance with a particular human factors criteria. The occupant representation, vehicle, vehicle system, and geometric representation of the interaction may be animated in three-dimensions permitting views from various perspectives.

An advantage of the present invention is a method and system for vehicle design which considerably reduces vehicle design time.

Another advantage of the present invention is a method and system for vehicle design which can be applied to any vehicle system, device, or component which interacts with a vehicle occupant.

Yet another advantage of the present invention is a method and system which can be applied to both interior and exterior vehicle systems.

Still another advantage of the present invention is a vehicle design method and system which allows study of vehicle packaging feasibility early in the design process.

Another advantage of the present invention is a vehicle method and system which supports computer aided engineering (CAE) analysis and rapid prototyping.

Another advantage is a method and system for vehicle design which provides informed design decision making which supports vehicle program timing, and which reduces late design changes.

Yet another advantage of the present invention is a vehicle design system and method which provides flexibility in vehicle design while not being constrained by timing requirements imposed in traditional prototype design development.

Still yet another advantage is a vehicle design system and method which provides generic, ergonomically sound parametric automated design of various portions of a vehicle.

A feature of the present invention is a vehicle design system and method which provides accelerated, three-dimensional solid modeling of automated human factors studies in packaging of vehicle systems.

Another feature of the present invention is the ability of a vehicle designer to easily alter any factor with the result that the system and method automatically rebuilds every other effected dimension so that packaging alternatives can be quickly studied.

BRIEF DESCRIPTION OF THE DRAWINGS

The file of this patent contains at least one drawing executed in color. Copies of this patent with color drawings will be provided by the Patent and Trademark Office upon request and payment of the necessary fee.

These and other objects, advantages, and features of the present invention will be apparent to those skilled in the art upon reading the following description with reference to the accompanying drawings, in which.

DETAILED DESCRIPTION OF THE PREFERRED EMBODIMENT

Figure 1:
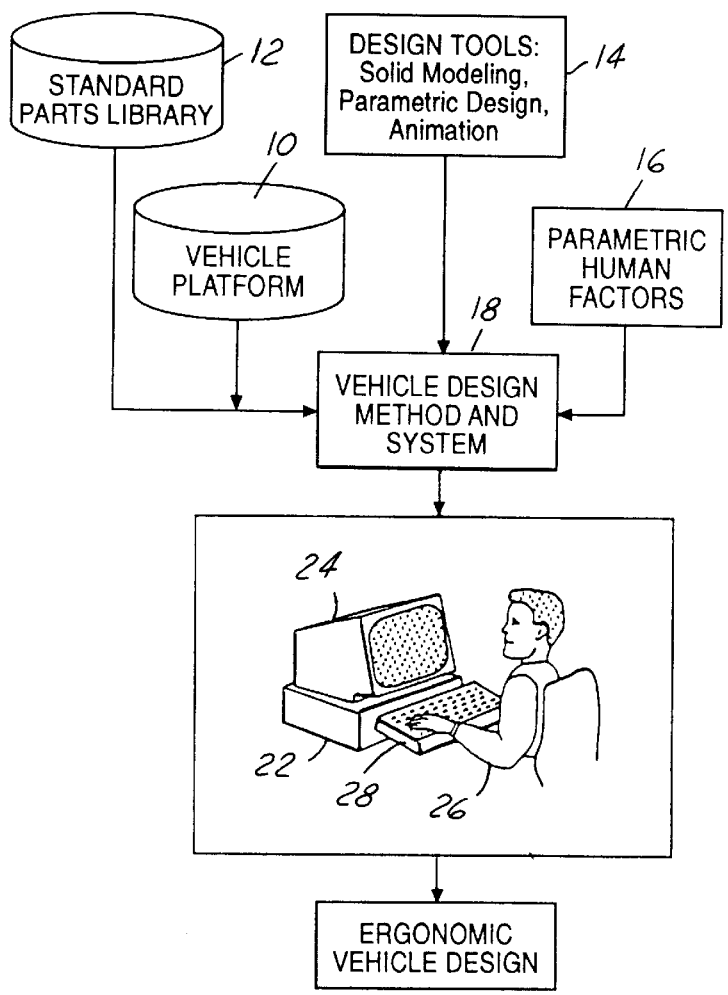
FIG. 1 is a flow chart illustrating various parts of a system for designing an automotive vehicle according to the present invention.

Automotive vehicle design, and in particular design of a portion of an automobile, is achieved according to the present invention with a generic, parametric driven design process. This process allows flexibility in vehicle design, including performance of numerous ergonomic studies in a small fraction of the time required with conventional vehicle design. The present invention enables an acceptable design to be achieved in minutes, as opposed to days and weeks previously required. Various computer based tools are integrated to achieve this enormous time and expense savings, including solid modeling, parametric design, automated studies, and a non-parametric component library, sometimes called a standard parts library. Referring to FIG. 1, the tools used by the method and system of the present invention are shown graphically. Vehicle platforms are electronically represented on an electronic storage device 10, which includes representation of vehicle sheet metal, for 10 example. A standard parts library 12, also stored on an electronic medium, has electronic representations of production parts and generic parts, for example. Packaging studies with these parts are done to assess many factors, including the potential for reuse and complexity reduction, thus saving engineering time and resources. Various design tools, shown generally at 14, can be used for this packaging task. Solid modeling takes electronically stored vehicle platform data and standard parts data and builds complex geometry providing part-to-part or full assembly interference checking. Several commercial solid modeling programs are available and generally known to those skilled in the art, such as Pro/Engineer® and IDEAS®. Solid modeling also allows three-dimensional visualization through use of rendering and animation systems, such as Vislab®, while being compatible with other computer aided engineering and rapid prototyping computer applications.

Parametric design is used in the electronic construction of vehicle geometry within a computer for ergonomic studies, components and assemblies. As certain dimensions, or parameters are modified, the computer is instructed to regenerate a new vehicle or part geometry. The parametric human factor studies, generally shown at box 16, control and limit the design process in accordance with ergonomically desirable parameters, as is further discussed below.

Still referring to FIG. 1, the computer implemented method and system of the present invention, shown at box 18, advantageously combines all of the foregoing to provide efficient, flexible, rapid design of a vehicle, or a portion of a vehicle, which meets predefined ergonomics requirements. As seen in FIG. 1, the present invention is implemented on a computer system 22, including a processor and a memory, which can provide display and animation of vehicle, occupant, and vehicle part electronic representations on a display such as a video terminal 24. Other communication output means can be used, including but not limited to, a plotter, a printed report, and a rapid prototype, such as stereolithography. Parameter selection and control for the design method can be accomplished by a user 26 via a keyboard 28, or other user interaction device, such as a mouse or a SpaceBall™. One input method could include a pop-up window with all current parameters, including an on-line description for the parameter and a current value therefor. Other input methods will occur to those skilled in the art. For example, parametrics values may be picked from a table within a two-dimensional mode since some vehicle designers prefer to view an assembly in sections which can be laid out on a drawing.

Figure 2:
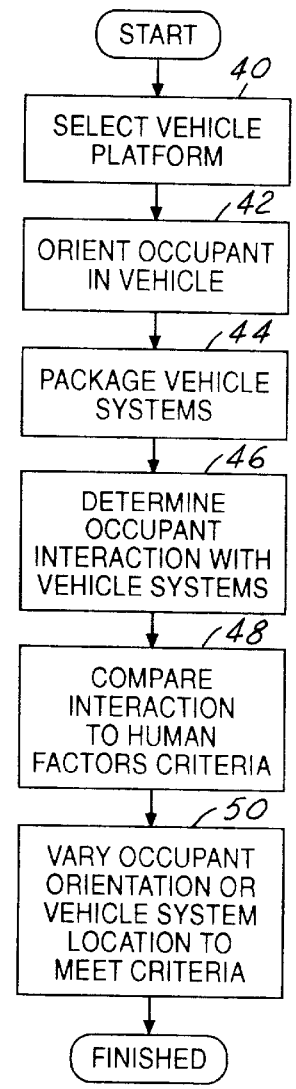
FIG. 2 is a flow chart of one embodiment of a method for designing a vehicle according to the present invention.

Turning to FIG. 2, a flowchart of a method according to the present invention is shown. In box 40 of FIG. 2, a vehicle platform is selected so that an electronic representation of vehicle sheet metal, including a floor pan, is available (FIG.

3). It should also be understood that use of the term vehicle in this disclosure implies an electronic representation of at least a portion of at least a portion of a vehicle, for example the floor pan sheet metal. Vehicle platform selection is optional, it being understood that occupant orientation and vehicle system packaging, as next described, need only be situated with respect to a common referenced point.

Figure 2A:
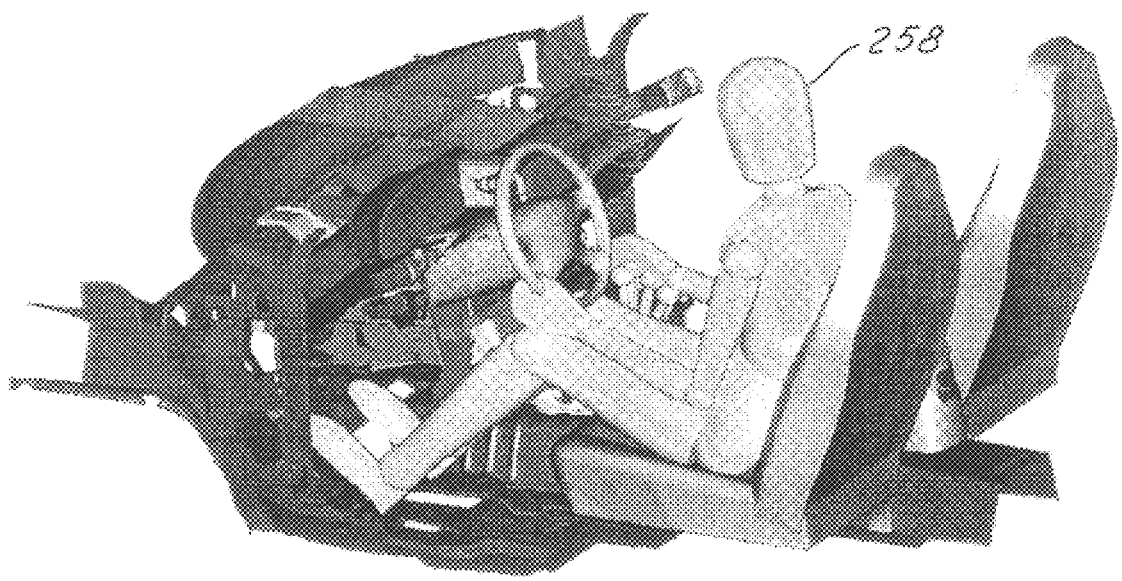
FIG. 2A is a color perspective view of a portion of an automotive vehicle having an occupant representation situated thereon representing a 95% male.
Figure 2B:
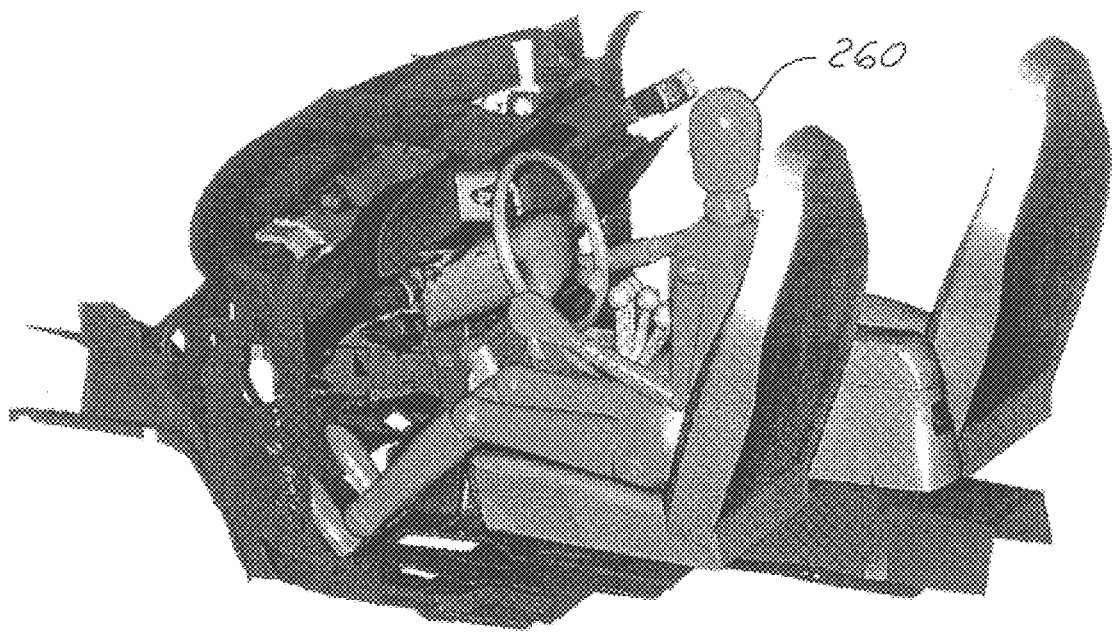
FIG. 2B is a color perspective view of a portion of an automotive vehicle having an occupant representation situated thereon representing a 5% female.

In box 42 of FIG. 2, an occupant representation is oriented in the vehicle. For purposes of this disclosure, orientation of an occupant means specifying or selecting values for a set of occupant position parameters which represent various occupant locations with respect to the vehicle. These occupant position parameters may include data for the three-dimensional location of an occupant hip point, a distance between an accelerator heel point and the occupant hip point, and occupant back angle. Selection of an occupant type, for example, may also be important so that occupant attributes, such as arm length and head height, are known. Various occupant types may be selected, including that for a 95% male 258 (FIG. 2A) and the 5% female 260 (FIG. 2B). Representation of an occupant in the form of a mannequin, as is done in many of the drawings herein disclosed, including FIGS. 2A and 2B, is for user convenience only and is not necessary for operation of the method and system of the present invention. Rather, selection of certain occupant orientation parameters is all that is required. Those skilled in the art will recognize that other occupant position parameters may also be used, and that only one, or a combination of parameters, may be required to orient an occupant representation within the vehicle. Selection will depend on the particular human factors study to be performed.

After the occupant has been oriented as described above, various systems, devices, or components are then packaged on the vehicle. For purposes of this disclosure, packaged means that an electronic representation of the dimensions of the system, device, or component are geometrically related to the vehicle three-dimensional electronic reference frame or coordinate system. These systems may include, but are not limited to, instrument panel clusters, heating, ventilation, and air conditioning (HVAC) control panels and outlet ducts, door trim, glove box, air bags, knee bolsters, a steering wheel and column, a center console, a manual shift device, pedal packages, overhead consoles, visors, rear view mirrors and monitors, "heads up" displays, power trains, seats, and electronic clusters, including radios, tape players, CD players, video displays and joy sticks for drive by wire. Vehicle systems is intended to include any part of the vehicle which will interact with an occupant, either directly or indirectly. Those skilled in the art will recognize that the foregoing list is intended to be illustrative only and not exhaustive. It should also be understood that occupant orientation (box 42) and packaging of vehicle systems (box 44) need not be accomplished in the order indicated in FIG. 2, but can be done in reverse order, or intermingled, that is, various systems may be packaged, the occupant oriented within the vehicle, and other systems subsequently packaged.

When the occupant is oriented and the vehicle systems are initially packaged as described above, occupant interaction with the vehicle systems is then determined. For purposes of this disclosure, occupant interaction means any possible interaction between the occupant and one or more of the vehicle systems. Occupant interaction may include, but is not limited to, reach, sight, smell, vibration, touch, proximity, clearance, sound, and feeling, including temperature (heat and cold). It should be understood that there may be other occupant-to-vehicle interactions which are not listed here. The occupant interactions may be determined in many ways, including generating reach zones, vision zones, reflection zones, interaction zones, and clearance zones. The reach zones include, but are not limited to, a maximum push-button reach zone, a maximum three-finger reach zone, a maximum full-hand grasp reach zone, a minimum reach zone, and steering wheel finger reach zones. Vision zones include, but are not limited to an occupant interior downlook zone, exterior forward and rearward downlook zones, rim-block zones, and mask lens zones. Reflection zones may include, but are not limited to a windshield reflection zone, a side window reflection zone, a rear view reflection zone, and a cluster lens reflection zone. Clearance zones may include, but are not limited to, a head clearance zone, and clearance zones around the steering column, manual shifter, automatic transmission shift lever, seat hand clearance zones, a signal lever clearance zone, and foot clearance zones. The aforementioned occupant interactions are determined with the design tools described above, including solid modeling, parametric design and animation. Those skilled in the art will understand that other design tools may also be used to determine various occupant interactions with the vehicle systems. Three dimensional geometric interaction, lack of interaction, and interference between an occupant and vehicle systems are generated. These may then be communicated to the user, such as by reporting or displaying as previously described. Animation on a video screen in three-dimensions with different colors representing various vehicle systems, occupant interactions, and occupant representations is preferably used to effectively communicate study results. However, a report of the occupant interaction, such as a dimensional distance between an occupant representation and a vehicle system, may be sufficient. In addition, a report indicating a Noise, Vibration and Harshness (NVH) level, a temperature level, a stress, a strain, or fluid flow characteristics, for example, may suffice for design acceptability determinations. These may be determined through use of various tools which can be integrated into the system and method of the present invention, such as Finite Element Analysis (FEA) or Computational Fluid Dynamics (CFD).

Still referring to FIG. 2, when occupant interactions have been determined, they may be compared to a set of human factors criteria, as shown in box 48. The human factors criteria comprise a set of data or information which specifies a preferred occupant-to-vehicle interaction. Such criteria may include, for example, the requirement that all vehicle systems on an instrument panel center stack be within a three-finger grasp zone. Numerous other human factors criteria similar to the occupant interaction can be used in the comparison of box 48. The comparison may be done visually, such as viewing an occupant interaction from various perspectives of the vehicle, occupant, and vehicle systems. For example, reach surfaces may be displayed to show whether an occupant is able to reach, grasp, or push buttons on a radio positioned on the instrument panel. The surfaces so displayed form reach zones such that vehicle system controls, such as buttons, which are occupant accessible appear in an accessibility zone on an occupant side of the surface, while those controls which are inaccessible appear in an inaccessibility zone on an instrument panel side of the surface.

If an occupant interaction does not meet a corresponding human factors criteria, adjustment to the vehicle design can be made by varying the occupant orientation, the vehicle systems locations, or both, or any of the generic parameters, as shown in box 50 (FIG. 2). This variation can be iteratively accomplished until the human factors criteria are met. Alternatively, adjustment of the various parameters may be non-iteratively performed, that is, a vehicle designer may change one or more of the parameters based on past design experience. Variation may be conducted interactively through user 26 input (FIG. 1), or alternatively the steps of FIG. 2 may be iteratively performed until an acceptable design is reached or a conclusion is made that such a design is not possible. It should be understood that variation of the occupant orientation or the vehicle systems is optional and that the human factors criteria may or may not be required to be met.

When a change is made to the occupant orientation, a vehicle system, or any design parameter, for example a locational change with respect to the chosen coordinate system, regeneration of the entire vehicle design is electronically performed (box 52 of FIG. 2). During this regeneration step, appropriate relationships between the occupant representation, the vehicle systems, and the vehicle are automatically determined, and vehicle systems are automatically changed according to the revised parameters. That is, the method and system of the present invention will automatically rebuild every other affected dimension so that packaging alternatives can be quickly studied. In the regeneration step, originally selected vehicle systems or devices may need replacement to fit with the new design. This replacement is automatically done by selection of vehicle systems or devices from the electronic parts library to meet the vehicle system change, for example a locational change. It should therefore be understood that some changes to a vehicle design are selected by a vehicle designer, as discussed above and further discussed below with respect to FIG. 13, while other changes are accomplished automatically by the system and method of the present invention to accommodate designer specified changes. This feature allows packaging alternatives to be quickly studied.

Figure 3:
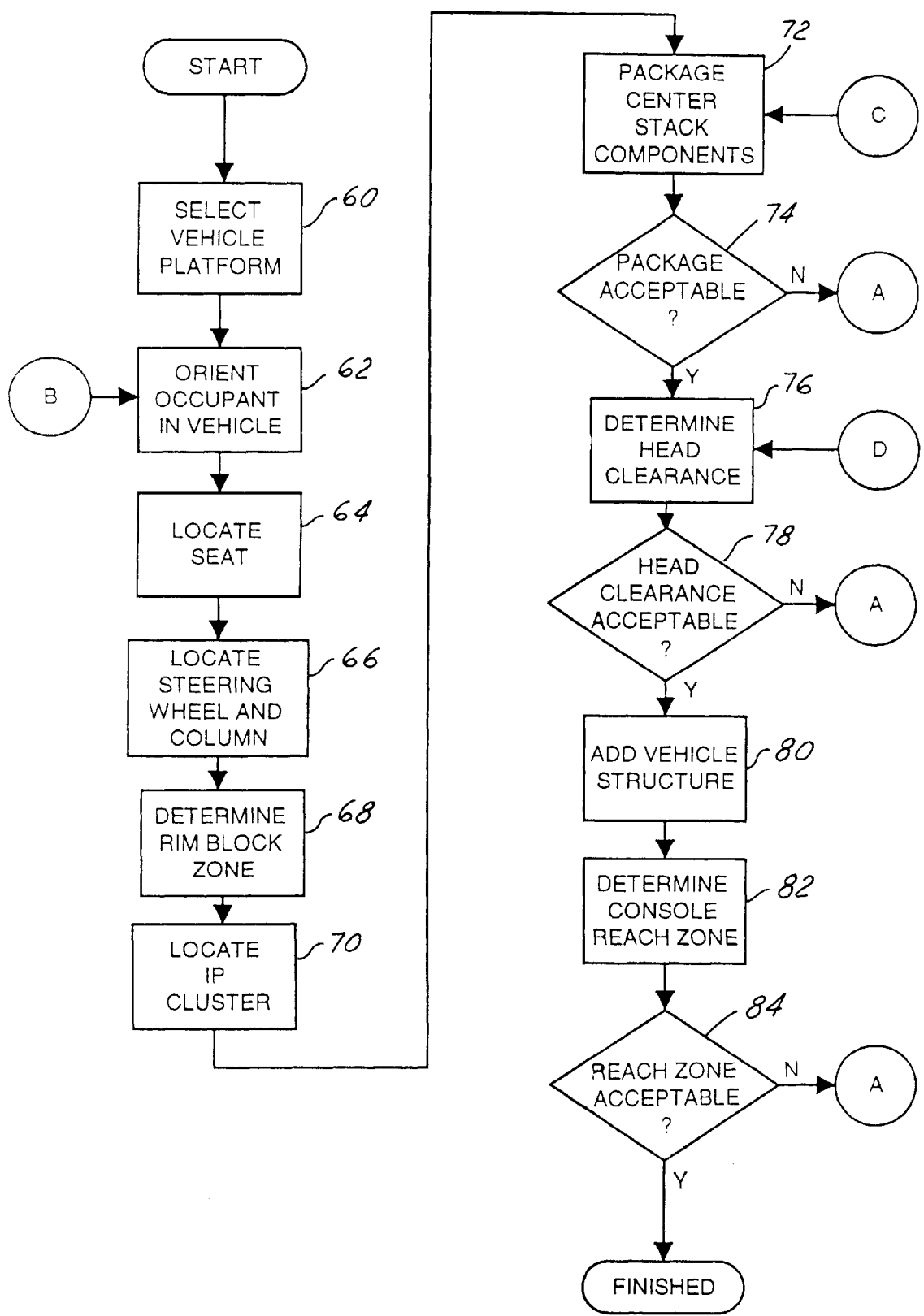
FIG. 3 is a flow chart of a detailed embodiment of a method for designing a vehicle according to the present invention.
Figure 4:
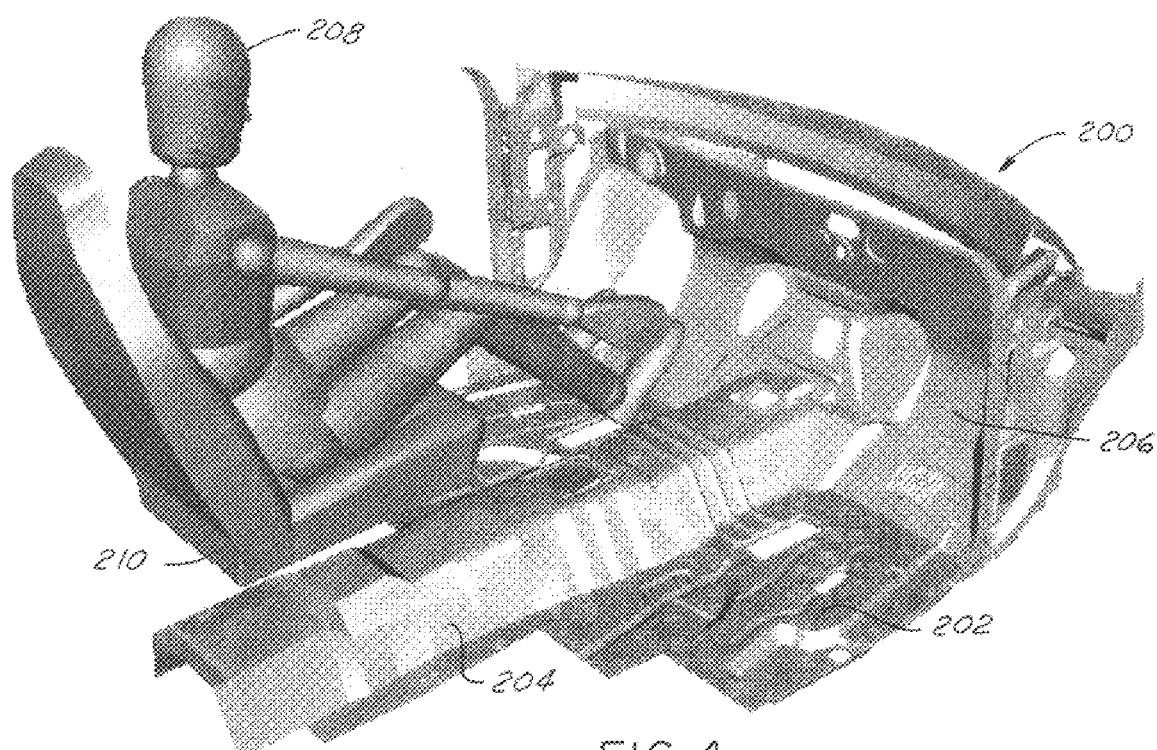
FIG. 4 is a color perspective view of a portion of an automotive vehicle showing an occupant representation oriented on a seat therein.

Turning now to FIG. 3, a detailed example of one embodiment of the method of the present invention is shown beginning at box 60. As seen in FIG. 4, a vehicle platform 200, shown in light gray, is selected to generate a three-dimensional, electronic representation of a floor pan 202, a transmission tunnel 204, and a front wall 206 (all shown in light gray). It should be understood that display of the vehicle platform 200 shown in FIG. 4 is optional and not required for the method of the present invention. Selection of a vehicle platform may be from a list of vehicle platforms and will determine the three-dimensional coordinates of the platform in an electronic form as represented in the memory of the computer 22. In addition, a new vehicle platform may be developed and used as a coordinate reference system for the present invention.

After selection of the vehicle platform, an occupant representation 208, shown in yellow in FIG. 4, is orientated in the vehicle as depicted in box 62 of FIG. 3. Orientation of the occupant representation 208 is accomplished as described above. In box 64, a seat 210 (orange) is located with respect to the vehicle platform 200 and the occupant representation 208, and the location of the seat 210 with respect to the occupant 208 will in part determine the type of seat which may be used in construction of the vehicle.

Figure 5:
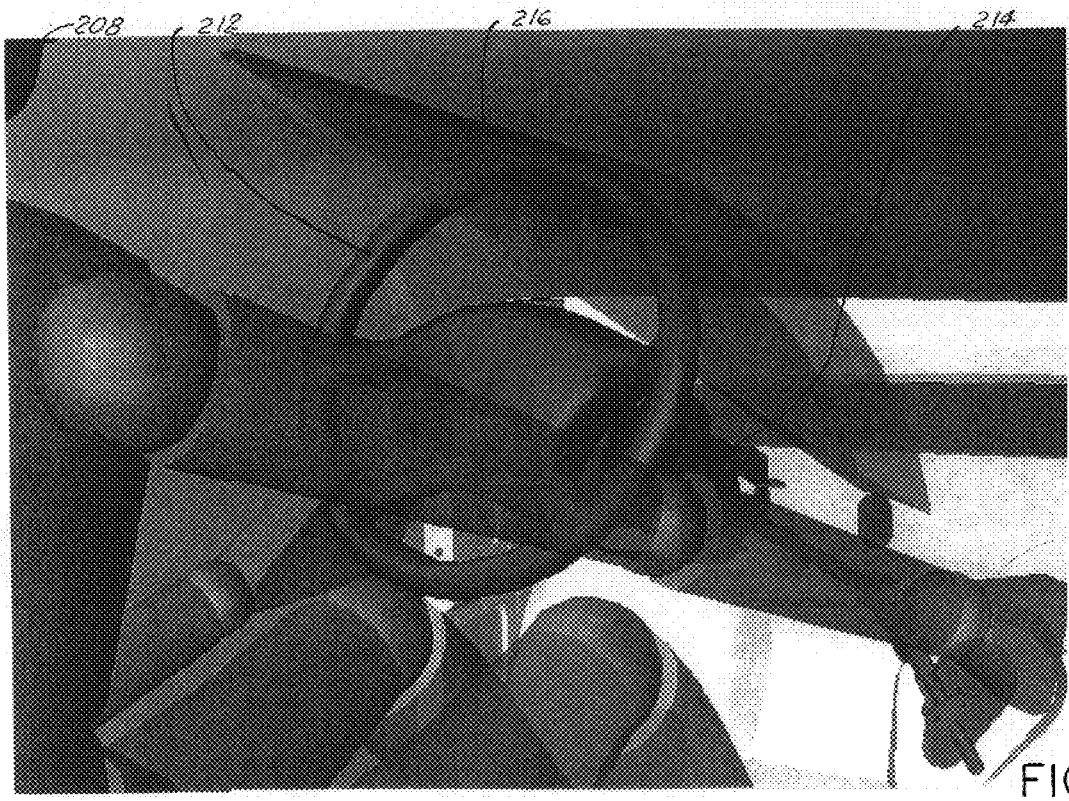
FIG. 5 is a color perspective view showing an occupant representation, a steering column, a steering wheel, and a rimblock zone.

After the seat 208 has been located, a steering wheel 212 and steering column 214 ( shown in green FIG. 5) are located (box 66 of FIG. 3). As with all of the systems packaged by the method of the present invention, the steering wheel and column may be selected from a list of electronic representations of those parts. The steering wheel and column are located such that the occupant in the driver's seat is able to access and easily use the steering wheel 212.

Figure 6:
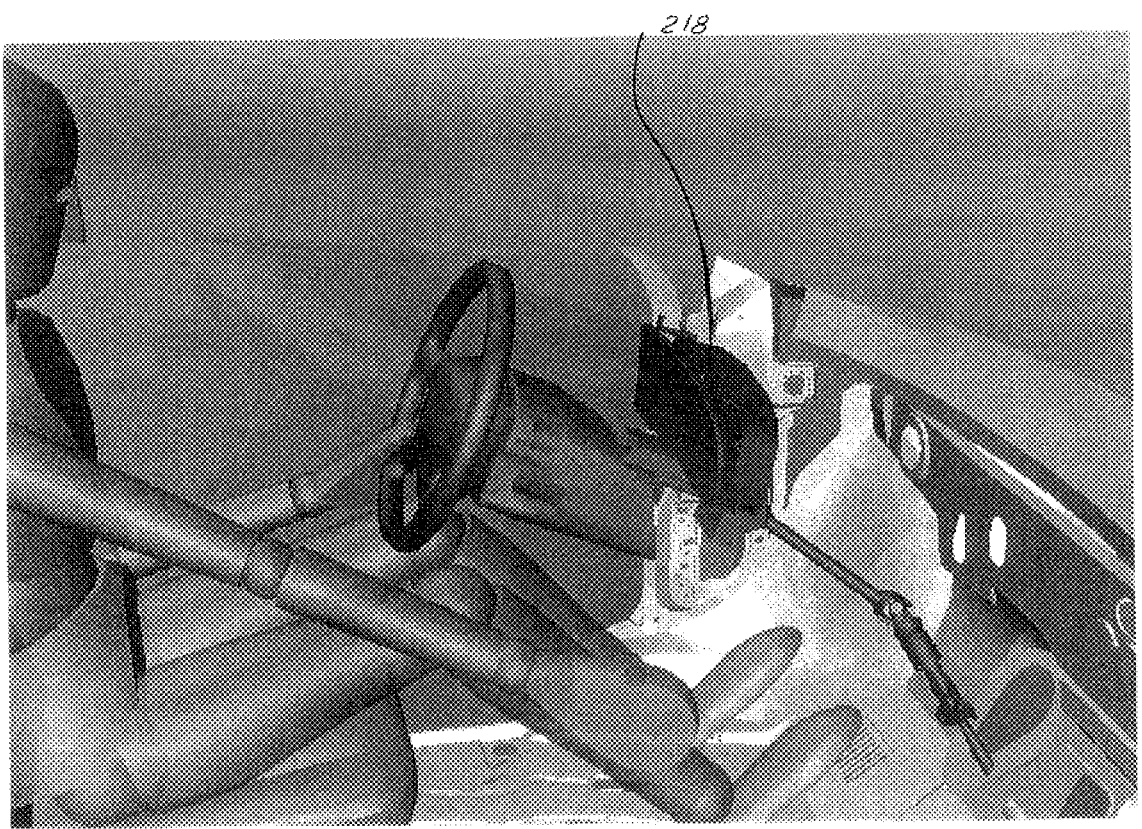
FIG. 6 is a color perspective view showing an occupant representation, a steering column and wheel, and an instrument cluster packaged according to a rimblock zone analysis according to a method of the present invention.

When the steering wheel has been located, a rimblock study is performed (box 68 of FIG. 3) which determines, electronically, a zone which is obstructed from the driver's view in the forward direction. This zone is referred to as a rimblock zone 216 (shown as yellow-green in FIG. 5) and is used for proper placement of an instrument panel cluster containing gauges and other vehicle performance indicating devices. The IP cluster 218 (purple, FIG. 6) is placed out of the rimblock zone 216 in box 70 of FIG. 3.

Figure 7:
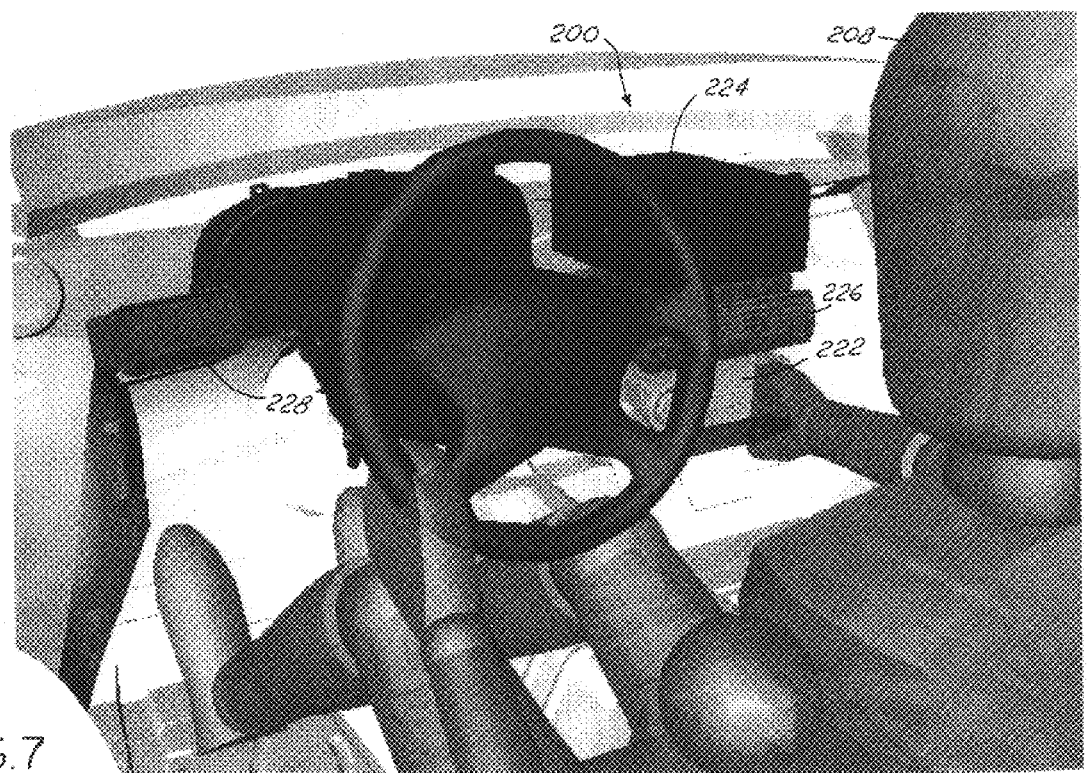
FIG. 7 is a color perspective view showing packaging of various instrument panel components according to the present invention.
Figure 8:
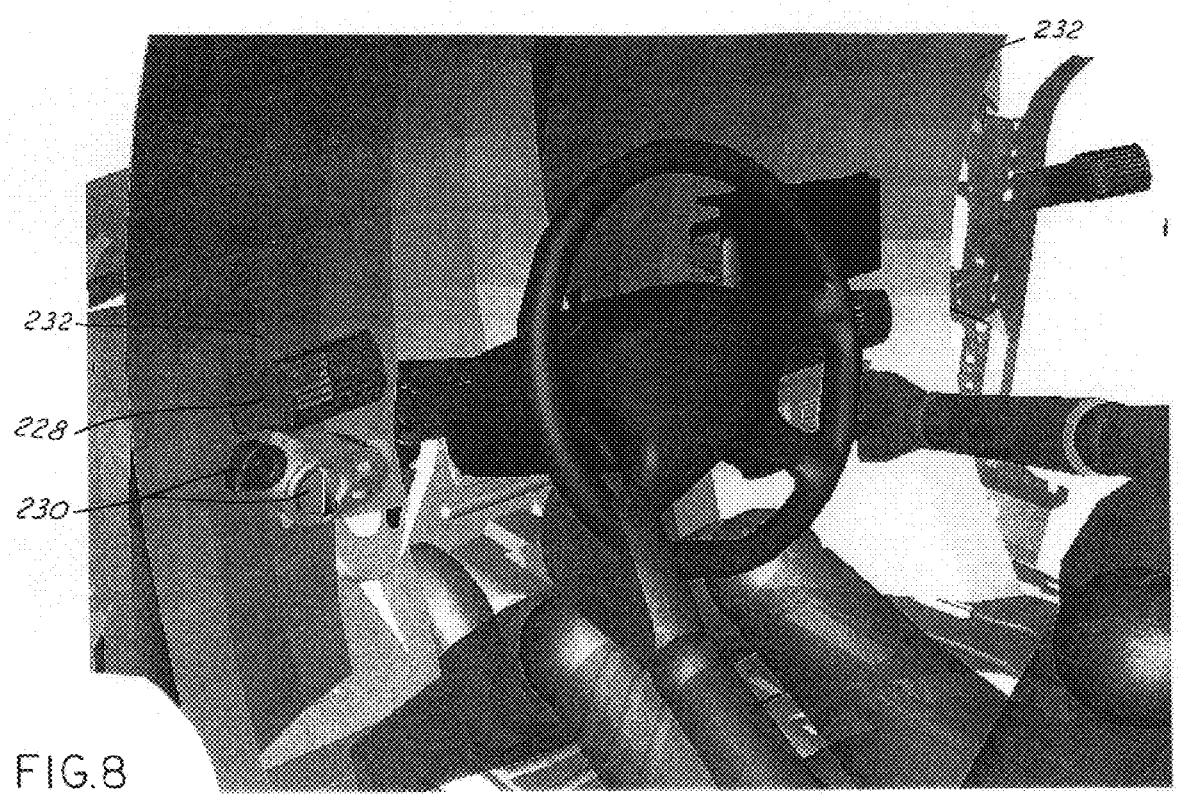
FIG. 8 is a color perspective view of a maximum push-button reach zone for determining occupant interaction with vehicle system.

After the IP cluster has been located, the center stack components are packaged (box 72 of FIG. 3). The center stack, generally indicated at 220 (FIG. 7), is that portion of the instrument panel in the center of the vehicle typically containing a panel, or panels, having instrument controls for vehicle audio electronics 222 (light yellow), HVAC controls 224 (black), and the like. The center stack may also contain HVAC outlets 226 (light purple). It should also be understood that other HVAC outlets 228 (light purple) and instrument panel controls 230 (light yellow and red, FIG. 8) may also be packaged during this step of the method of the present invention, for example, lighting controls (light yellow) for both the exterior and interior may be located outboard of the steering column on the instrument panel (FIGS. 7 and 8). Packaging of these components for purposes of this disclosure means selecting a device, component, or system and electronically representing such in a location proximate other vehicle structure so as not to interfere with adjacent components or structure.

Figure 9:
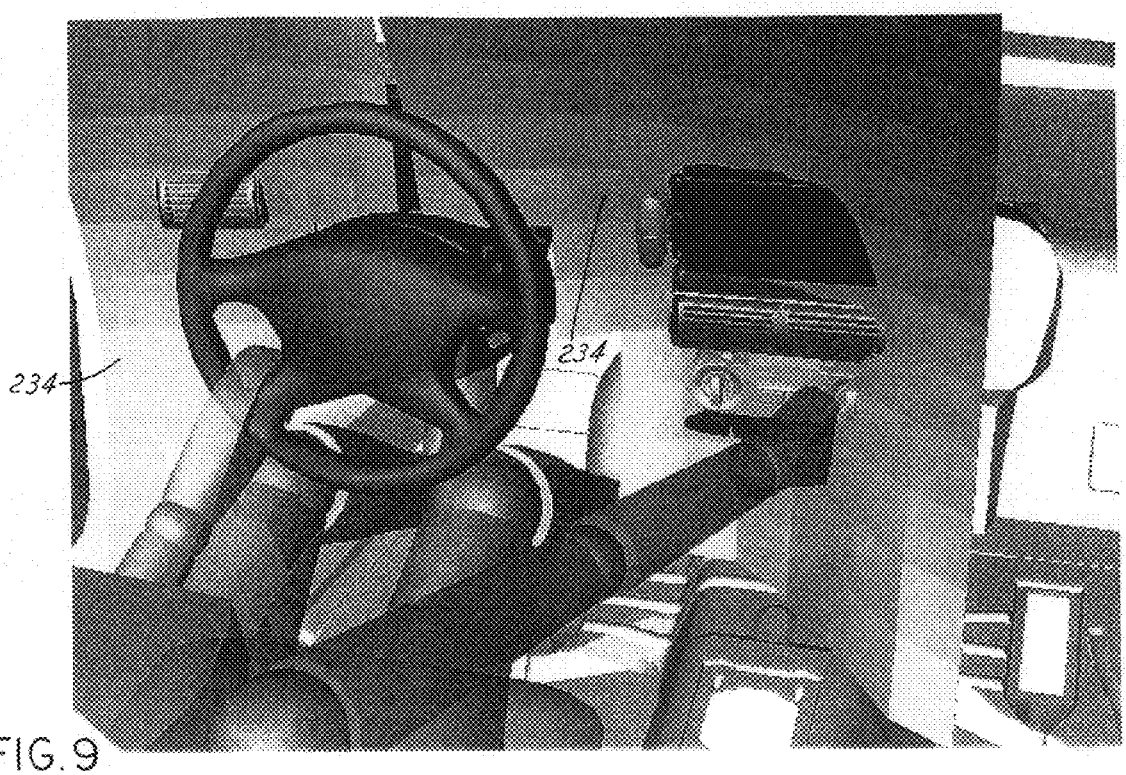
FIG. 9 is a color perspective view showing a maximum 3-finger reach zone.
Figure 10:
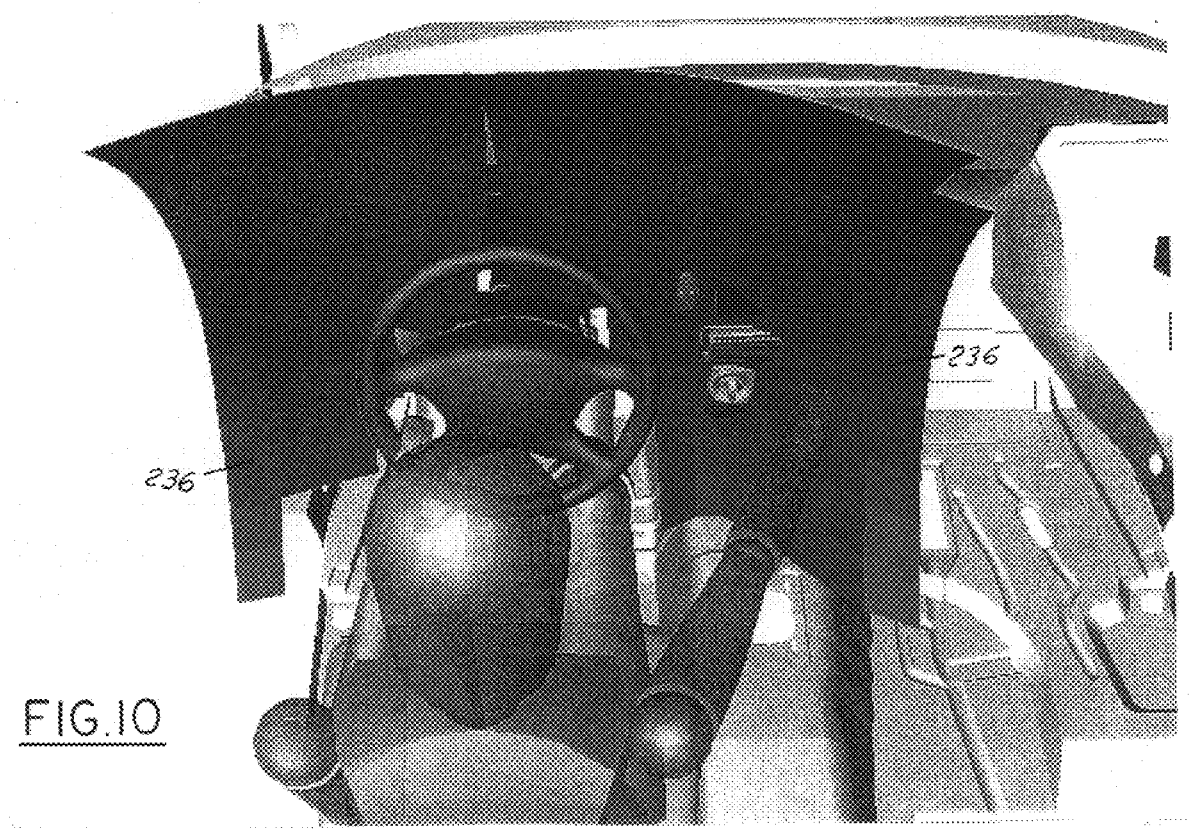
FIG. 10 is a color perspective view showing a full grasp reach zone.
Figure 11:
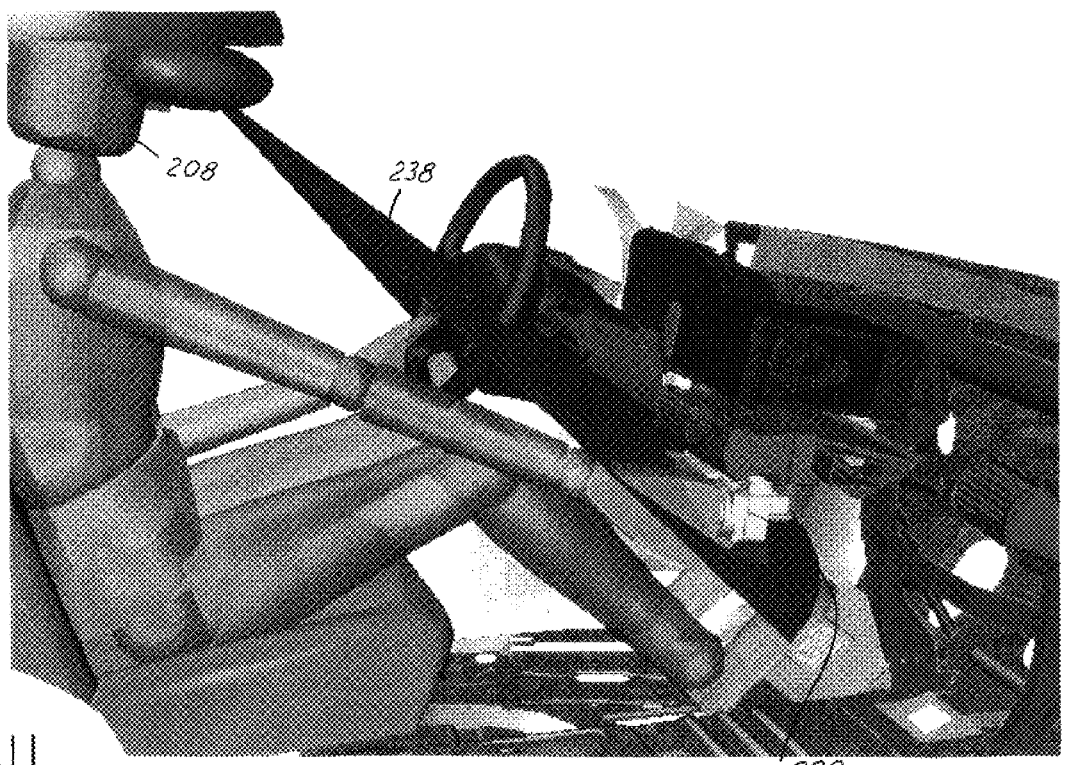
FIG. 11 is a color perspective view showing an occupant down look zone.

After the instrument panel components, devices, and systems have been packaged, various studies may be electronically performed to determine whether the package is satisfactory from a human factors criteria standpoint. Such studies may include, for example, a maximum reach zone is created by a maximum reach surface 232 (various shades of orange and yellow in FIG. 8), a three-finger grasp zone is created by a three-finger grasp surface 234 (various shades of green in FIG. 9), a full grasp zone is created by a full grasp surface 236 (various shades of pink in FIG. 10), and a down look zone is created by a down look surface 238 (dark red, FIG. 11). Such studies yielding the aforementioned zones, and others, provide a designer with information regarding the ergonomic viability of the design. For example, FIG. 11 indicates that a vehicle occupant 208 would not be able to see all of the radio 222 (yellow) since part of it is below the down look surface 238 (dark red). Objects below the down look surface 238, which for purposes of FIG. 11 is toward the bottom, are not capable of being seen by the occupant 208 without movement of the head, eyes, or both. The down look surface 238 thus creates a non-visual zone which a vehicle designer can use for ergonomic placement of vehicle systems, components, or devices.

The down look surface 238 can be created by sweeping a line from an eyellipse through a predetermined arc, as is further described below with reference to FIGS. 21–23.

Figure 12:
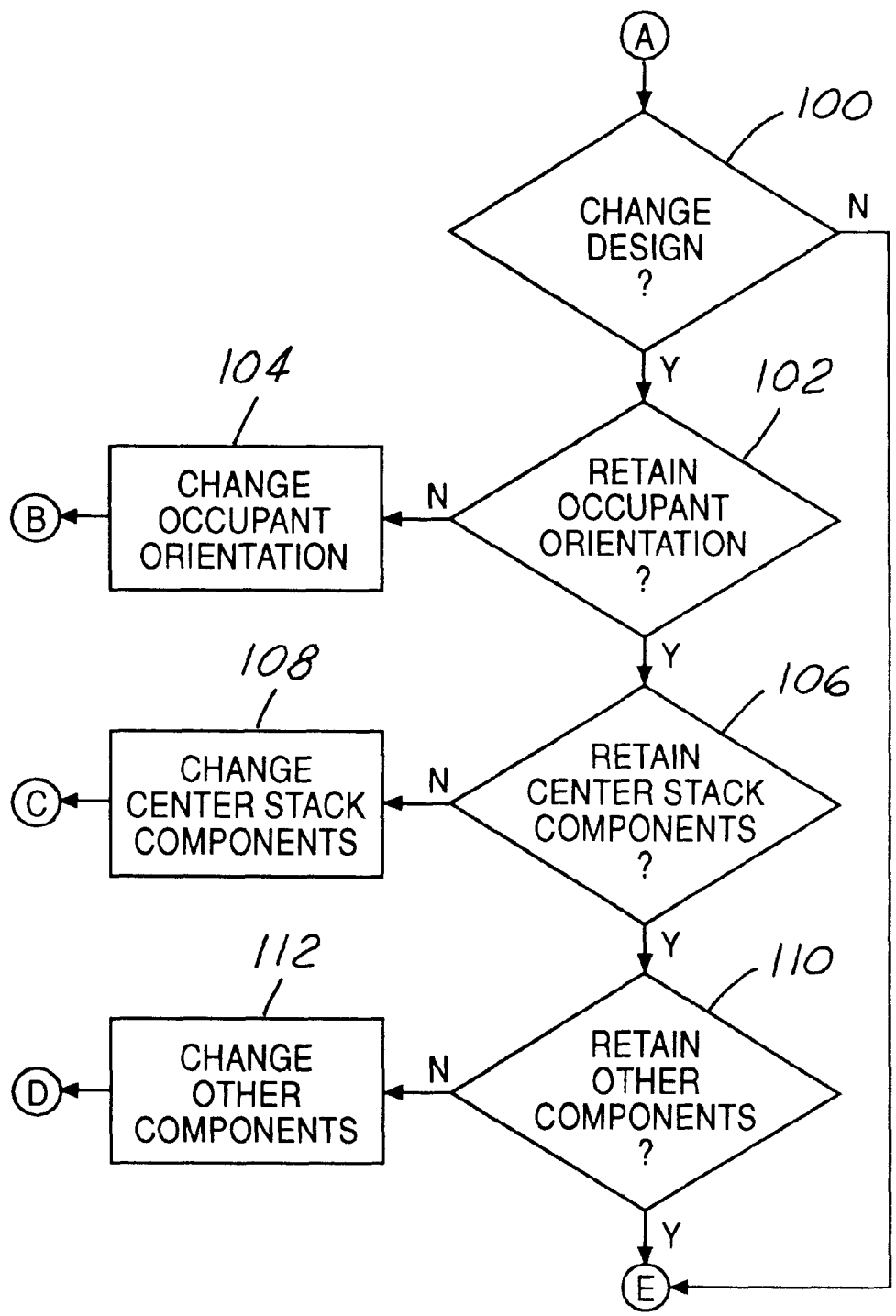
FIG. 12 is a flow chart showing a design change process optionally used with the vehicle design method according to the present invention.

Should the packaging be unacceptable from a human factor perspective, vehicle design alteration may be made, as shown in decisional diamond 74 (FIG. 3). A design alteration determination flow chart, as shown in FIG. 12, may be used to perform changes to vehicle design, if any. In the first decisional diamond 100 of FIG. 12, the desire for design change is questioned. If the decision is made not to change vehicle design despite it not meeting designated human factor criteria, the flow is returned to the flow chart in FIG.

3 at entry point D. Such a decision may be made, for example, when non-ergonomic considerations outweigh the desirability of design change for ergonomic reasons.

Continuing with FIG. 12, should there be a desire to investigate changing the vehicle design, retention of the current occupant orientation is made in the second decisional diamond 102. If it is determined not to retain the current occupant orientation, then a change is made thereto in box 104, and the flow is returned to entry point B in the flow chart of FIG. 3. However, if it is determined to retain the current occupant orientation, the flow in FIG. 12 moves to the third decisional diamond 106 where it is determined whether to retain the current packaging configuration of the center stack components. If it is determined not to retain these current center stack components, the change is made in box 108 and the flow is returned to entry point C in the flow chart of FIG. 3. However, if it is determined to retain the current packaging of the center stack components, the flow in FIG. 12 goes to the fourth decisional diamond 110 wherein it is determined to retain other vehicles components. If it is determined not to retain other vehicle components, then those components, or a subset thereof, are changed in box 112 and the flow returns to entry point D in the flow chart of FIG. 3. However, if it is determined to retain the other vehicle components, then flow is returned to entry point D in the flow chart of FIG. 3 without any changes having been made to the vehicle design. It should be understood that the just described vehicle design change flow chart of FIG. 12 is optional and that the method and system of the current invention need not employ such a design change method or means for accomplishing such. It should further be noted that there are numerous possibilities for design change flow chart logic, and that FIG. 12 is meant to be illustrative and not limiting.

Figure 13:
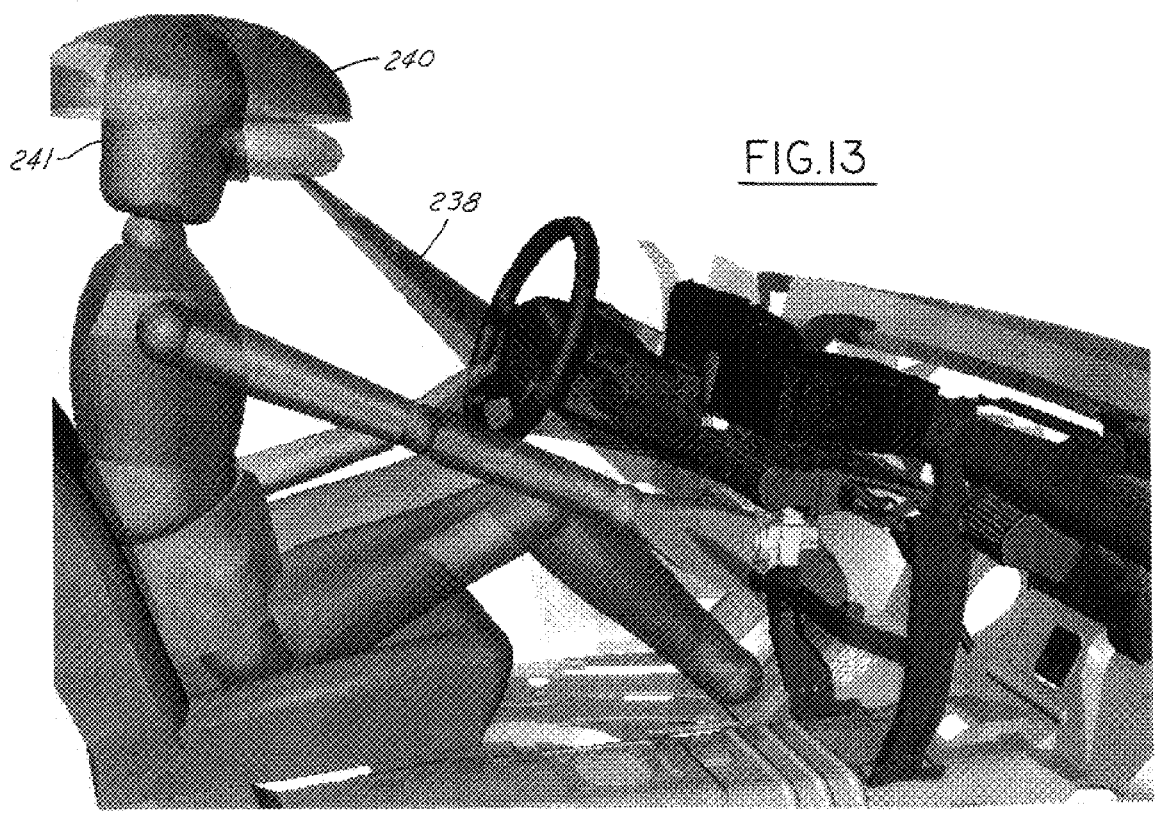
FIG. 13 is a color perspective view showing a head clearance zone.

Returning now to the flow chart of FIG. 3, if the vehicle systems packaging is found acceptable in decisional diamond 74, then occupant head clearance is determined in box 76. In the decisional diamond 78, if the head clearance for the occupant is not acceptable, a vehicle design change analysis is conducted according to the flow chart of FIG. 12, as previously described. However, if the occupant head clearance is acceptable, the flow of FIG. 3 moves onward. Occupant head clearance is determined by generating the head clearance zone 240 as seen in FIG. 13. The zone may be generated, for example, by creating a solid ellipsoid at a predetermined head clearance offset from an occupant head 241 (FIG. 13).

Figure 14:
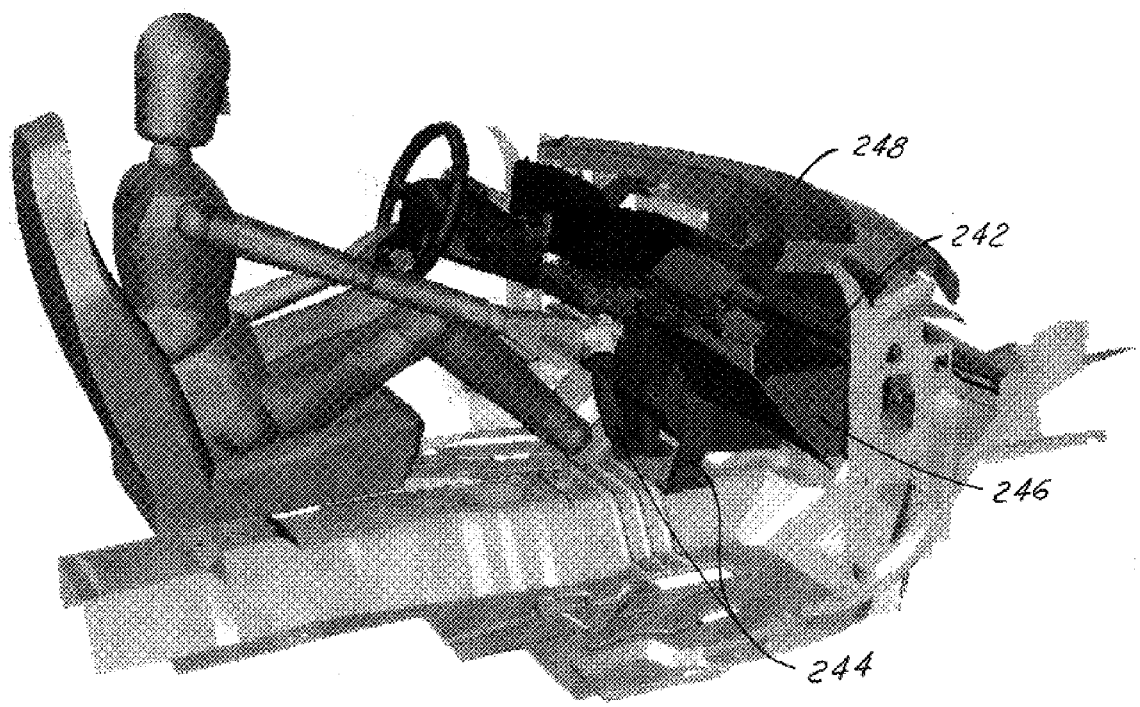
FIG. 14 is a color perspective view showing addition of vehicle structure by the vehicle design method according to the present invention.
Figure 15:
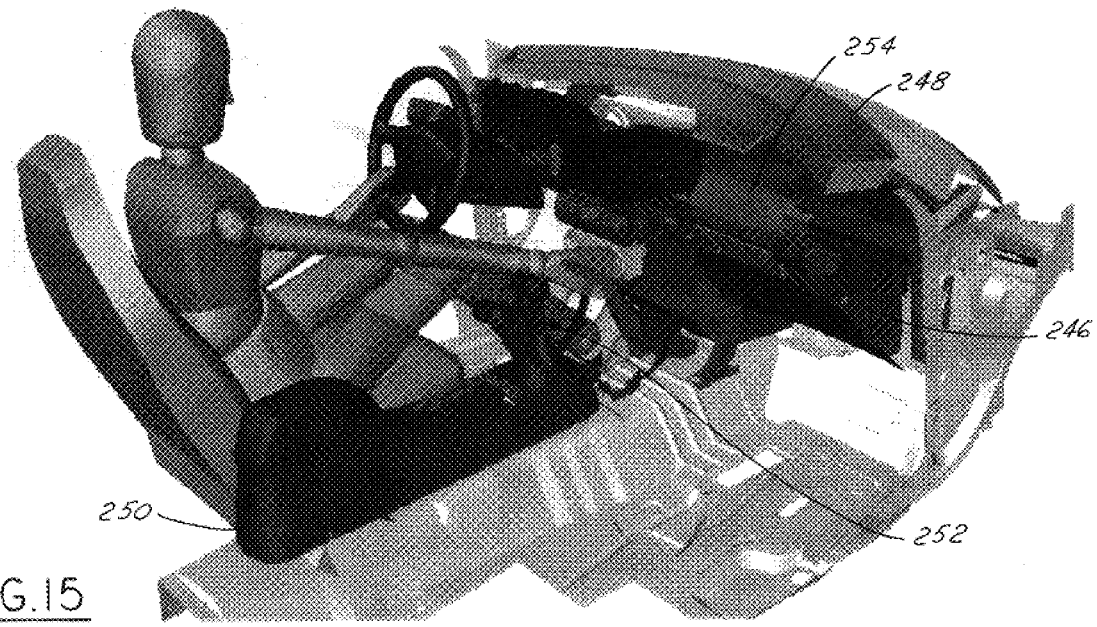
FIG. 15 is a color perspective showing the addition of a center console.
Figure 16:
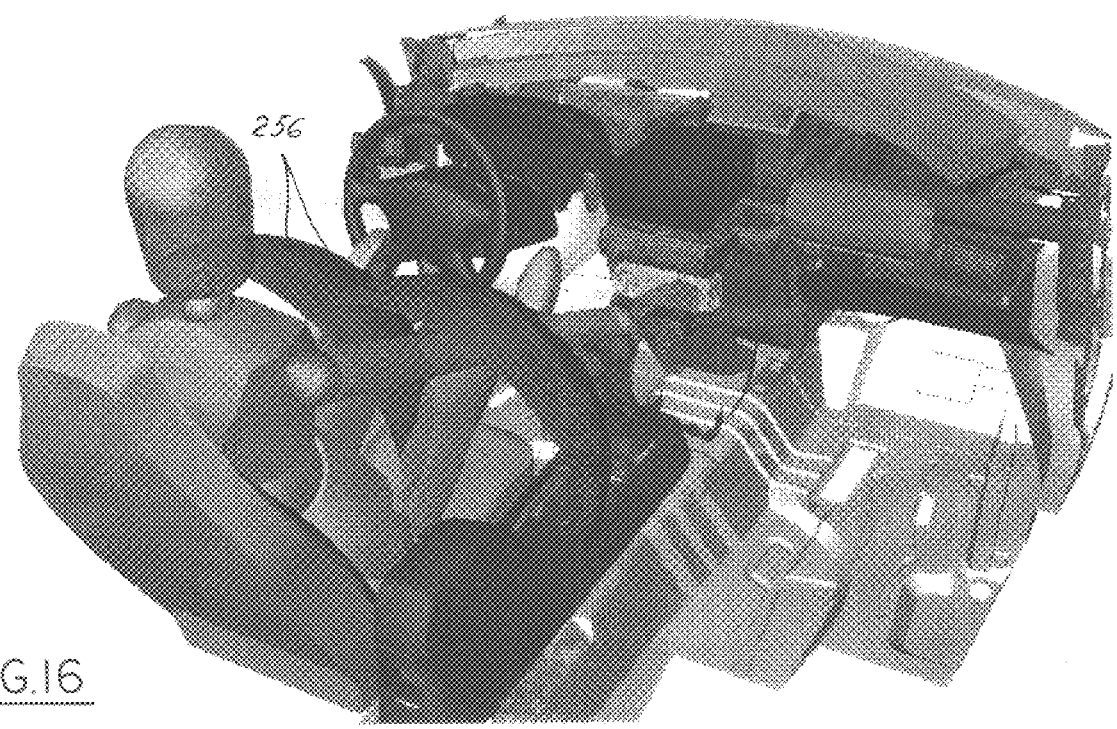
FIG. 16 is a color perspective showing a minimum reach zone.

In box 80 (FIG. 3), vehicle structure is added, including but not limited to, a cross car beam 242 and support brackets 244, a glove box 246, a windshield cowl 248, a center console 250, a manual gear shifter 252, and an air bag 254 (FIGS. 14 and 15). Other items may also be added, such as door trim, knee bolsters, a manual shift device, pedal packages, overhead consoles, visors, rear view mirrors and monitors, "heads up" displays, power trains, seats, and electronic clusters, including radios, tape players, CD players, video displays and joy sticks. In box 82, a console reach zone is determined and in decisional diamond 84, if the reach zone is unacceptable, then a design change flow as described above with reference to FIG. 12 is followed. If, however, the reach zone is acceptable, then the design process is finished. Part of the determination of whether the console reach zone is acceptable includes generation and comparison of a minimum reach zone 256 (FIG. 16) to a predetermined minimum reach criteria. For example, a minimum reach zone may be a zone beyond a surface created by the reach of an occupant hand when the elbow of the arm is against the seat back. Such a minimum reach zone may be expanded, or other minimum reach zones may be defined.

Figure 17:
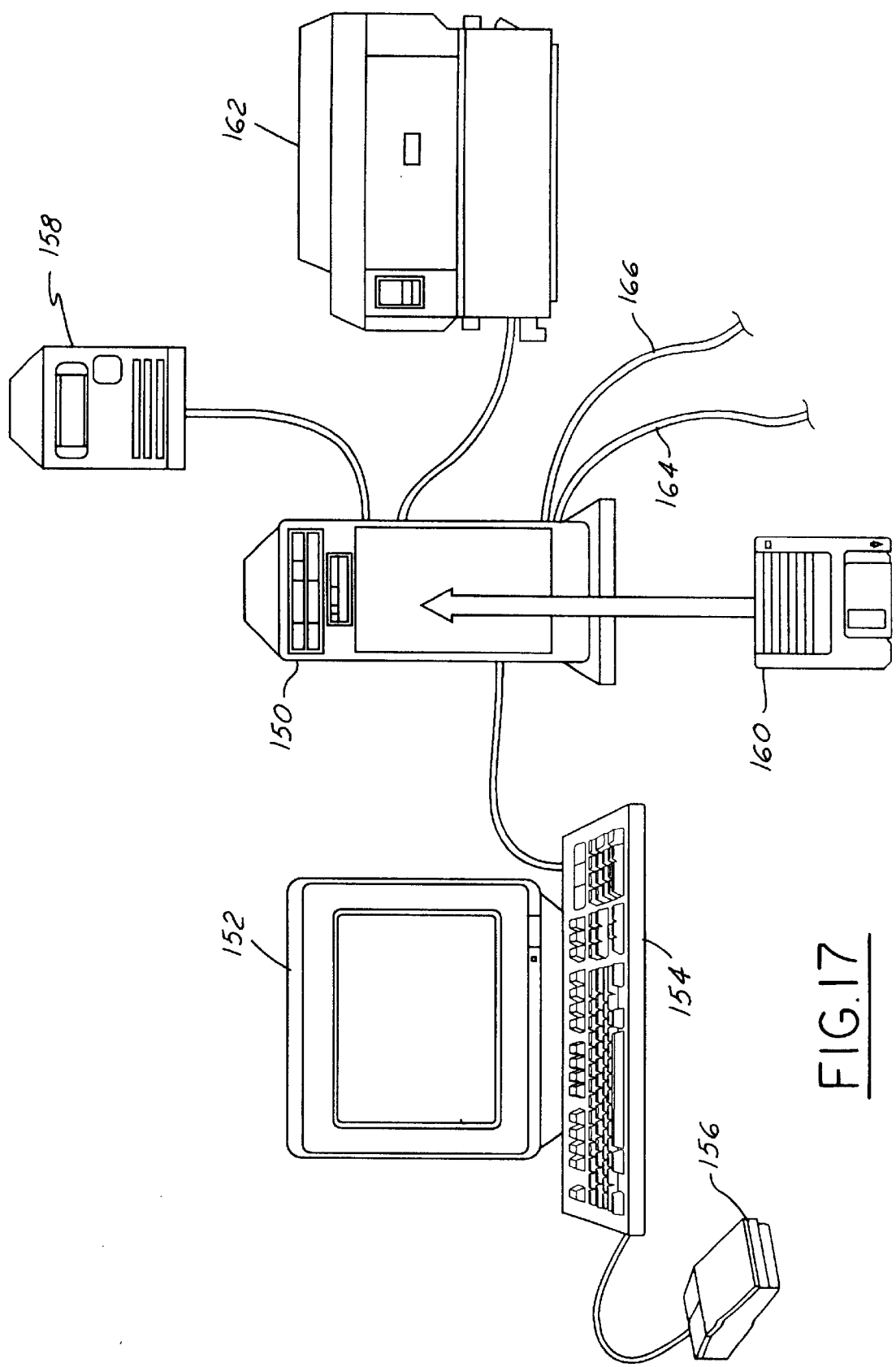
FIG. 17 is a view of a system for designing a portion of an automotive vehicle according to the present invention.

A representative system for occupant based vehicle design according to the present invention is depicted in FIG. 17. The system includes a processing unit 150 connected to a user interface which may include a display terminal 152, a keyboard 154, a pointing device, such as a mouse, 156, and the like. The processing unit 150 preferably includes a central processing unit, a memory, and stored instructions which implement a method for vehicle design according to the present invention. The stored instructions may be stored within the processing unit 150 in the memory, or in any non-volatile storage such as magnetic or optical media, EPROM, EEPROM, or the like. Alternatively, instructions may be loaded from removal magnetic media 160, such as a removal disk, sometimes called a floppy disk, optical media 158, or the like. In a preferred embodiment, the system includes a general purpose computer program to implement the functions illustrated and described with reference to FIGS. 1–16. Of course, a system according to the present invention could also be embodied with a dedicated device which includes various combinations of hardware and software. The preferred embodiment may also include a printer 162 connected to the processing unit 150, as well as a server and a connection to an intranet 164 or the Internet 166. Preferably, solid modeling software, parametric design software, animation software, the like are used for developing a system according to the present invention.

It should be understood that the method and system of the present invention may be used for a wide variety of vehicle design tasks and is not limited to that shown in FIGS. 2–16. Such tasks may include determining occupant reach within a vehicle, reflection of light within the vehicle, occupant interaction with the vehicle, occupant view of vehicle systems, and many others.

The present invention is meant to encompass a vehicle design method and system in a computer environment for allowing a vehicle designer to determine occupant-to-vehicle interaction between computer electronic representations of the occupant and the vehicle, or systems on the vehicle, and to report the outcome of such a study to the vehicle designer.

Various human factor studies may be performed in addition to, or in place of, those described above. Studies which may be performed include eyellipse centroid location, head clearance zones for a 95% or a 99% occupant of either gender, peripheral and glance down look surfaces, optimum back angle, preferred steering wheel center, arm rest surface zone, door side impact zone, torso angle, G-factor for use with reach zone generation, accelerator pedal angle, seat track mid-point determination for use with knee bolster zone generation, leg clearance zones, forward and rearward down look surfaces, manual transmission stick shift hand clearance zone, optimum neutral shift location and variation plane, hand recommended pattern and spacing curves for stick shift location for each gear position from the optimal neutral location. Other vision human factor studies which may be determined include a 95% and a 99% rimblock tunnel from the steering wheel to a graphics plane, a rim and hub study, multi-function stalk blockage zone, cluster lens reflection study based on a trim cover opening, various masks lens studies, maximum and minimum trim cover opening blockage studies, a lens reflection zone study, a windshield reflection zone, and driver A, B, and C vision zones. A knee bolster zone and a door speaker location zone can be included. In addition, various pedal package zones may be generated using various design parameters, for example step-over heights for the clutch, brake, and acceleration pedals. A foot clearance envelope zone may also be used as may a wiper path zone, hand brake path and clearance zone, hand clearance around a seat, and head impact zones. Leg and thigh clearance may also be used.

As seen in the foregoing list, there are numerous human factor studies which may be conducted to provide a vehicle designer with information for enhancing vehicle ergonomics. The present invention is not, of course, limited to those studies described above as the list is meant to be illustrative and not limiting.

For various vision and reflection related human factors studies of the present invention, an eyellipse is created in a geometric form. An eyellipse, for purposes of this disclosure, means a geometrical representation of eye location of a given population, for example 95% of vehicle drivers. The geometry takes the form of an ellipsoid and is further described in SAE J491. As with other geometry created by the method and system of the present invention, logic is employed for such creation and may be expressed as equations of numbers and variables, geometric relationships, if-then loops, and other methods. In general, the logic is used to apply engineering and ergonomic knowledge, to reduce work required to perform similar operations, and to allow the geometry to change based on a designer's inputs.

Figure 18A:
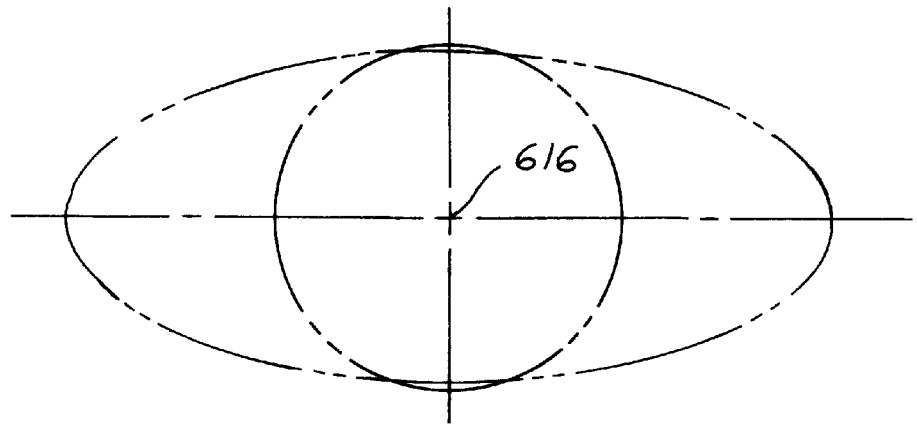
FIG. 18A shows orientation of an ellipse for use in creation of an eyellipse.
Figure 18B:
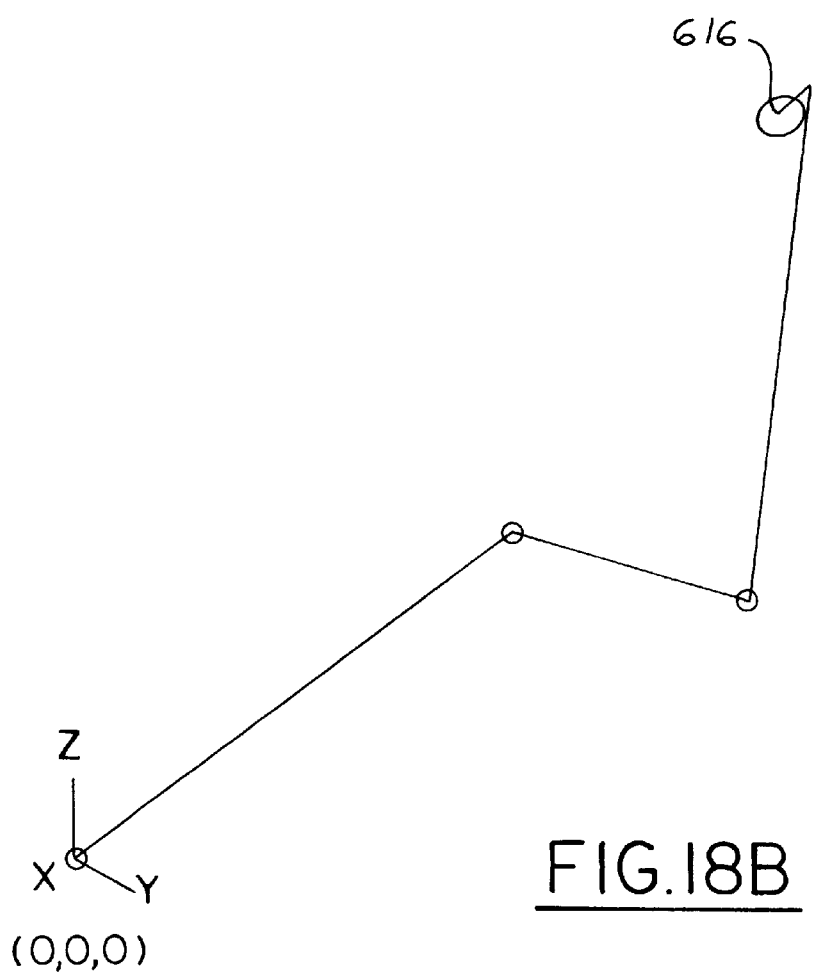
FIG. 18B is a perspective view showing orientation of a pair of eyellipses with respect to a vehicle coordinate system.
Figure 19A:
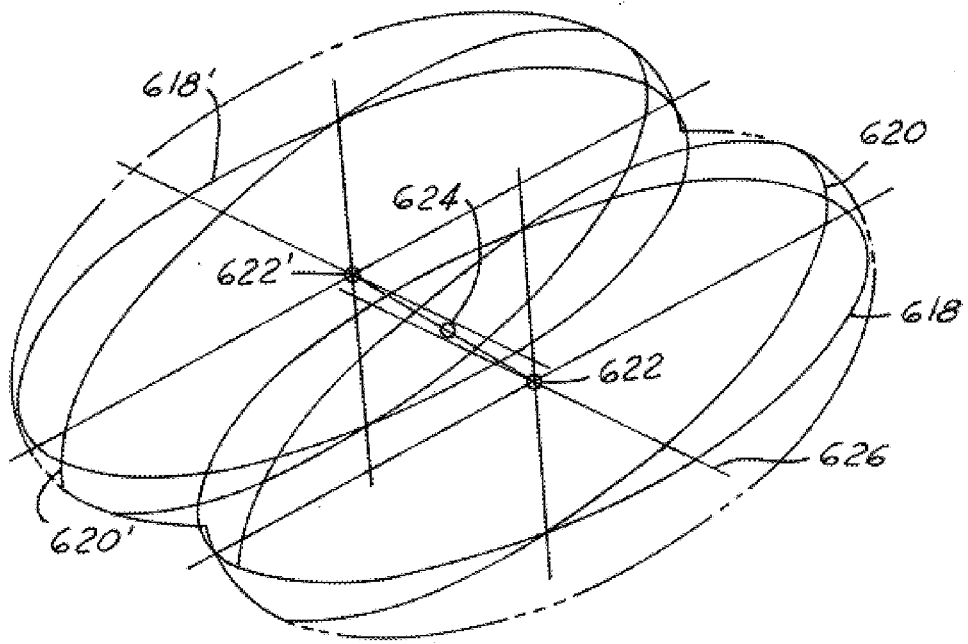
FIG. 19A is a perspective view of a pair of eyellipses representing probable eye locations of a given occupant population.
Figure 19B:
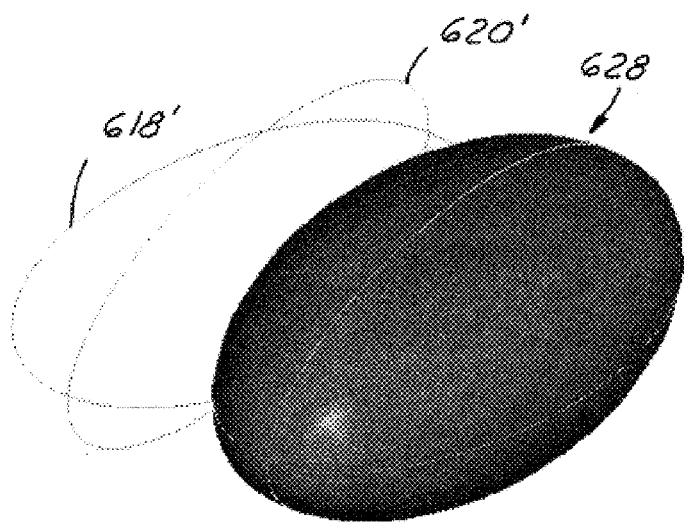
FIG. 19B is a perspective view of an eyellipse and a pair of orthogonal ellipses.
Figure 20A:
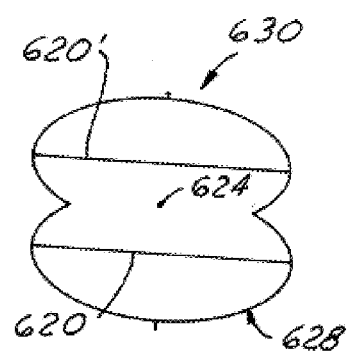
FIGS. 20A and 20B show plan and side perspective views of the pair of eyellipses of FIG. 19A.
Figure 20B:
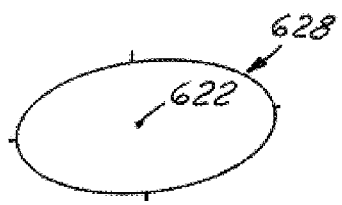

Eyellipse creation, which is performed once for each eye of a vehicle driver or occupant, an eyellipse center 616 (FIG. 18A) is located three-dimensionally with respect to a vehicle coordinate system, for example, in the X, Y, and Z directions (FIG. 18B), for each eye. After the center has been located, an ellipse shape is created, preferably based on SAE guidelines (Motor Vehicle Drivers' Eye Locations-SAE J941), for both a planview ellipse 618 and a side view ellipse 620 (FIG. 19A). It should be understood that a planview ellipse 618' and a side view ellipse 620' are created for the other eye as well (FIG. 19A). Each eyellipse has a centroid 622, 622', respectively, and an eyellipse pair centroid 624 (FIG. 19A) is defined a the midpoint between a line 626 connecting the eyellipse centroids 622, 622'. The ellipses 618, 620 and 618', 620' create frames (FIGS. 19A–20B) about which a surface is rendered to provide a three-dimensional representation of eyellipses 628, 630 for a left and right eye, respectively. It should be understood that the eyellipses 628, 630 intersect, as best seen in FIG. 19A and 20A.

Figure 21:
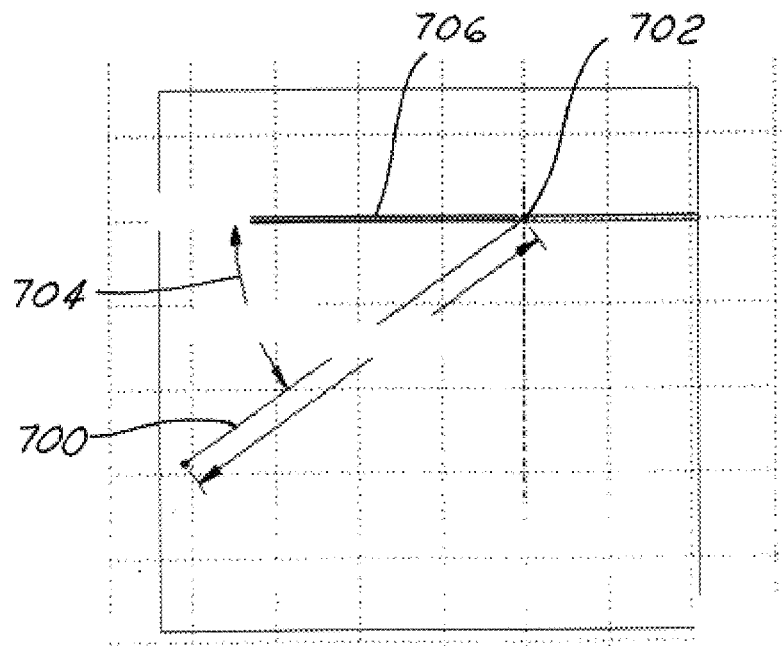
FIG. 21 shows creation of an eyellipse curve a desired angle for use with a downlook study according to the present invention.
Figures 22, 23:
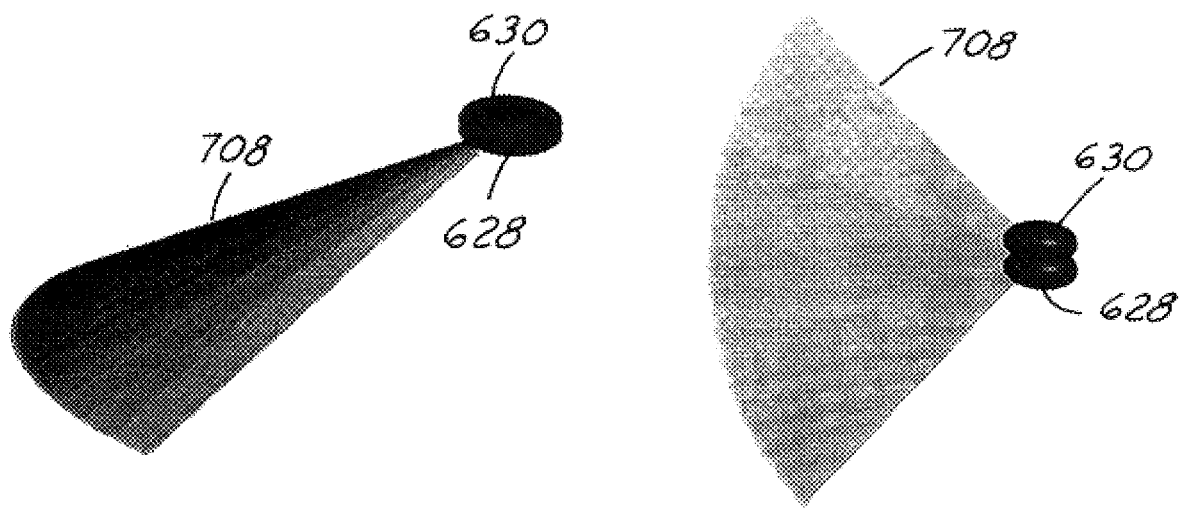
FIG. 22 is a side perspective view showing a downlook surface created with a pair of eyellipses.
FIG. 23 is a top view of FIG. 22.

For the downlook study described above, a curve 700 from an eyellipse centroid 702 is created at a desired downlook angle 704 from a horizontal plane 706, as seen in FIG. 21. The curve 700 can then be revolved 90° to create a downlook surface 708 (FIGS. 22–23). It should be understood that a downlook surface is created for each occupant eyellipse, and the downlook surfaces are superimposed to create a final downlook surface 238, which is then located within the vehicle and analyzed as described above with reference to FIG. 11.

While the form of the invention shown and described herein constitutes a preferred embodiment of the invention, it is not intended to illustrate all possible forms thereof. The words used are of description rather than limitation, and various changes may be made without departing from the spirit and scope of the invention as disclosed.

We claim:

1. A method for vehicle design on a computer having processor and a memory in which an occupant and at least one vehicle system are electronically represented with respect to a common reference point in a three-dimensional representation of a portion of a vehicle, the method comprising the steps of:

orienting an occupant representation with respect to the common reference point in the computer;

representing the at least one vehicle system with reference to the common reference point;

determining at least one occupant interaction between the occupant representation and the at least one vehicle system; and reporting the at least one occupant interaction.

2. A method according to claim 1 wherein the occupant interaction is determined based on a set of human factors criteria.

3. A method according to claim 2 wherein the set of human factors criteria includes at least one of a reach criteria, a vision criteria, an occupant reflection reception criteria, and an occupant-to-vehicle interaction criteria.

4. A method according to claim 1 wherein the occupant interaction is reported by displaying a geometric representation of the occupant interaction between the occupant representation and the at least one vehicle device.

5. A method according to claim 4 wherein the geometric representation is a surface which divides the passenger compartment into at least two zones.

6. A method according to claim 1 including the step of rendering a three-dimensional surface for the occupant representation, each of the at least one vehicle device, and the portion of the vehicle.

7. A method according to claim 1 including the step of animating movement of the occupant representation, at least one vehicle device, and the portion of the vehicle.

8. A method according to claim 2 including the step of determining a locational change for the at least one vehicle device, the occupant representation, or both, so that the occupant interaction meets the predetermined criteria.

9. A method according to claim 8 including the step of varying a device location of the at least one vehicle device with respect to the common reference point so that the occupant interaction meets the predetermined criteria.

10. A method according to claim 2 including the step of varying a device representation of the at least one vehicle device so that the occupant interaction meets the predetermined criteria.

11. A method according to claim 10 herein the device representation is selected from an electronically stored standard parts library.

12. A method for vehicle design on a computer having processor and a memory in which an occupant and at least one vehicle system are electronically represented with respect to a common reference point in a three-dimensional representation of a portion of a vehicle, the method comprising the steps of:

orienting an occupant representation with respect to the common reference point in the computer;

representing the at least one vehicle system with reference to the common reference point;

performing at least one human factors study between the occupant representation and the at least one vehicle system; and reporting an outcome of the at least one human factors study.

13. A method according to claim 12 wherein the at least one human factors study includes at least one of a reach study, a rimblock study, a knee bolster study, a mask lens study, a windshield reflection study, and a manual shift study.

14. A method according to claim 12 wherein the outcome of the at least one human factors study is reported by displaying a geometric representation of the occupant interaction between the occupant representation and the at least one vehicle device.

15. A method according to claim 14 wherein the geometric representation is a surface which divides the passenger compartment into at least two zones.

16. A method according to claim 12 including the step of rendering a three-dimensional surface for the occupant representation, each of the at least one vehicle device, and the portion of the vehicle.

17. A method according to claim 12 including the step of three-dimensionally animating movement of the occupant representation, the at least one vehicle device, and the portion of the vehicle.

18. A method according to claim 8 including the step of varying a device location of the at least one vehicle device with respect to the common reference point, varying a device representation of the at least one vehicle device, or both.

19. A method for designing a portion of an automotive vehicle on a computer system in which an occupant position and at least one vehicle device are electronically represented, the method comprising the steps of:

selecting a value for at least one occupant position parameter defining the occupant position;

determining an occupant interaction between the occupant position and the at least one vehicle device; and comparing the occupant interaction to a predetermined criteria.

20. A method according to claim 19 wherein the predetermined criteria comprise a set of human factors criteria.

21. A method according to claim 20 wherein the set of human factors criteria includes at least one of a reach criteria, a rimblock criteria, a knee bolster criteria, a mask lens criteria, a windshield reflection criteria, and a manual shift criteria.

22. A method according to claim 19 wherein comparison of the occupant interaction to the predetermined criteria includes displaying a geometric representation of the occupant interaction between the occupant position and the at least one vehicle device.

23. A method according to claim 22 wherein the geometric representation is a criteria surface which divides the passenger compartment into at least two zones.

24. A method according to claim 23 including the step of rendering a three-dimensional surface for the occupant position, each of the at least one vehicle device, the criteria surface, and the portion of the vehicle.

25. A method according to claim 24 including the step of animating movement of the rendered occupant position, at least one vehicle device, the criteria surface, and the portion of the vehicle.

26. A method according to claim 19 including the step of determining a locational change for the at least one vehicle device so that the occupant interaction meets the predetermined criteria.

27. A method for designing vehicle on a computer having a processor and a memory in which an occupant representation and at least one vehicle system are electronically represented with respect to a common reference point in a three-dimensional representation of a portion of a vehicle, the method comprising the steps of:

orienting the occupant representation with respect to the common reference point in the computer;

representing the at least one vehicle system with reference to the common reference point; and determining at least one occupant interaction between the occupant representation and the at least one vehicle system.

28. A method according to claim 27 wherein the occupant interaction is determined by displaying a geometric representation of the occupant interaction between the occupant representation and the at least one vehicle device.

29. A method according to claim 28 wherein the geometric representation is an interaction surface.

30. A method according to claim 29 including the step of rendering a three-dimensional surface for the occupant representation, each of the at least one vehicle device, the interaction surface, and the portion of the vehicle.

31. A method for designing a portion of an automotive vehicle in a computer system in which a vehicle design, an occupant representation, and a group of systems are electronically represented, the method comprising the steps of:

(a) selecting a set of generic parameters for describing occupant position in the vehicle passenger compartment and occupant interaction with respect to at least one vehicle surface within the vehicle environment;

(b) selecting a value for each of the set of generic parameters;

(c) generating at least one occupant-vehicle geometric representation based upon a predetermined occupant reach criteria and the set of generic parameters having the values selected in step (b); and (d) displaying the at least one occupant-vehicle interaction representation so as to create a plurality of occupant zones.

32. A method for packaging an integrated system on an automotive vehicle using a computer system in which a vehicle, an occupant representation, and a group of systems are electronically represented, the method comprising the steps of:

(a) orienting the occupant representation within a passenger compartment of the vehicle;

(b) selecting an initial package location for each of at least one of the group of systems having a system location on the vehicle;

(c) determining an occupant interaction between the occupant representation and each of at least one of the group of systems; and (d) comparing the occupant interaction of each of the at least one of the group of systems to a predetermined criteria.

33. A method according to claim 32 including the step of varying the package location of each of the at least one of the group of systems with respect to the occupant representation based upon a set of predefined rules until the occupant interaction meets the predetermined criteria.

34. A method for designing an automotive vehicle in a computer system in which a vehicle design, an occupant representation, and a group of systems are electronically represented, the method comprising the steps of:

(a) selecting a vehicle design from a vehicle platform including locating each of a group of systems on the vehicle at a system location;

(b) orienting an occupant representation within a passenger compartment of the vehicle;

(c) determining an occupant interaction between the occupant representation and each of the at least one of the group of systems;

(d) comparing the occupant interaction of each of the at least one of the group of systems to a predetermined criteria; and (e) varying the system location of the at least one of the group of systems with respect to the occupant representation based upon a set of predefined rules until the occupant interaction meets the predetermined criteria.

35. A method for designing an automotive vehicle in a computer system in which a vehicle, an occupant representation, and a group of systems are electronically represented, the method comprising the steps of:
  (a) orienting the occupant representation within a passenger compartment of the vehicle;
  (b) determining an occupant interaction between the occupant representation and each of at least one of a group of systems having a system location on the vehicle;
  (c) comparing the occupant interaction of each of the at least one of the group of systems to a predetermined criteria; and
  (d) varying a location of at least one of the group of systems, the occupant representation, or both so as to meet the predetermined criteria.

36. A method according to claim 35 wherein the predetermined criteria comprise a set of human factors criteria.

37. A method according to claim 35 wherein orienting the occupant representation is accomplished by selecting a value for at least one occupant position parameter.

38. A method according to claim 35 including the step of displaying a surface which divides the passenger compartment into at least two zones to represent the occupant interaction between the occupant representation and the at least one of a group of systems.

39. A computer aided method for designing a portion of an automotive vehicle, the method comprising the steps of:
  (a) storing in the memory of a computer system a first set of data representing an occupant position within a passenger compartment in the vehicle;
  (b) storing in the memory a second set of data representing a position for at least one occupant interactive vehicle system within the passenger compartment;
  (c) generating a third set of data representing an occupant interaction between the first set of data and the second set of data;
  (d) comparing the third set of data to a fourth set of data representing a predetermined occupant-vehicle interaction criteria to determine if the criteria is met.

40. A method according to claim 39 wherein the first set of data includes data representing at least one of the following:
  occupant hip point data;
  data representing a distance between an accelerator heel point and the occupant hip point; and
  occupant back angle data.

41. A method according to claim 39 wherein the third set of data is a geometric representation of the occupant interaction between the occupant representation and the at least one vehicle device.

42. A method according to claim 41 wherein the geometric representation is a surface which divides the passenger compartment into at least two zones.

43. A method according to claim 42 including the step of rendering a three-dimensional surface for the first, second, and third sets of data.

44. A method according to claim 42 including the step of three-dimensionally animating movement of the first, second, and third sets of data.

45. A method according to claim 39 including the step of varying the first set of data, the second set of data, or both, until the predetermined occupant-vehicle interaction criteria is met.

46. A method according to claim 39 wherein the fourth set of data stored in the memory representing a predetermined occupant-vehicle interaction criteria is a set of human factors data.

47. A method according to claim 46 wherein the set of human factors data includes at least one of a set of reach criteria data, a set of rimblock criteria data, a set of knee bolster criteria data, a set of mask lens criteria data, a set of windshield reflection criteria data, and a set of manual shift criteria data.

48. A portion of a vehicle satisfying a predetermined set of occupant based ergonomic criteria made from a design achieved by electronically representing on a computer an occupant representation and at least one vehicle system with respect to a common reference point, orienting the occupant representation within the vehicle, determining an occupant interaction between the occupant representation and the at least one vehicle system having a system location on the vehicle, and comparing the occupant interaction to the ergonomic criteria.

49. A portion of vehicle made according to claim 48 wherein the system location of the at least one vehicle system is varied with respect to the occupant representation until the occupant interaction meets the ergonomic criteria.

50. A portion of vehicle made according to claim 48 wherein the occupant interaction is compared to the ergonomic criteria by displaying a geometric representation of the occupant interaction between the occupant representation and the at least one vehicle system.

* * * * *